(12) United States Patent
Gilbert

(10) Patent No.: US 7,777,552 B1
(45) Date of Patent: Aug. 17, 2010

(54) LOGARITHMIC AMPLIFIER WITH RMS POST-PROCESSING

(75) Inventor: Barrie Gilbert, Portland, OR (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/429,072

(22) Filed: Apr. 23, 2009

Related U.S. Application Data

(60) Provisional application No. 61/048,893, filed on Apr. 29, 2008.

(51) Int. Cl.
*G06F 7/24* (2006.01)
(52) U.S. Cl. ....................... 327/350; 327/348
(58) Field of Classification Search ......... 327/346–352, 327/355
See application file for complete search history.

(56) References Cited

U.S. PATENT DOCUMENTS

| | | | |
|---|---|---|---|
| 4,000,472 A | | 12/1976 | Eastland et al. |
| 4,998,289 A | * | 3/1991 | Rabe et al. ................. 455/423 |
| 5,027,118 A | * | 6/1991 | Nicolai ....................... 341/132 |
| 5,298,811 A | * | 3/1994 | Gilbert ....................... 327/351 |
| 5,489,868 A | | 2/1996 | Gilbert |
| 5,572,166 A | | 11/1996 | Gilbert |
| 6,172,549 B1 | | 1/2001 | Gilbert |
| 6,204,719 B1 | | 3/2001 | Gilbert |
| 6,429,720 B1 | | 8/2002 | Gilbert |
| 6,894,564 B1 | | 5/2005 | Gilbert |
| 7,002,394 B1 | | 2/2006 | Gilbert |
| 7,205,832 B2 | | 4/2007 | Andle |
| 2008/0297256 A1 | | 12/2008 | Eken |

OTHER PUBLICATIONS

Gilbert, Novel Technique for R.M.S.-D.C. Conversion Based on the Difference of Squares, Electronics Letters, vol. 11, No. 8, Mar. 11, 1975, pp. 181-182.
Gilbert, Monolothic Logarithmic Amplifiers, Rev. 1.7, 1994, pp. 1-122.
Gilbert, Translinear Circuits: An Historical Overview, Analog Integrated Circuits and Signal Processing, vol. 9, pp. 95-118, 1996, Kluwer Academic Publishers, Boston, MA, US.

(Continued)

*Primary Examiner*—Dinh T. Le
(74) *Attorney, Agent, or Firm*—Marger Johnson & McCollom, PC

(57) ABSTRACT

An RF measurement system includes an envelope detector to extract the modulation envelope of the RF input signal. The resulting baseband envelope signal is then applied to a statistics extraction circuit which provides a precise measure of the modulation envelope. The statistics extraction circuit can be implemented with any number of lower-frequency precision measurement technologies because the high-frequency carrier portion of the signal is removed, and thus, the demands on the post-envelope extraction circuit are greatly reduced. In one embodiment, the envelope detector and statistics extraction circuit may be implemented as a logarithmic amplifier followed by an RMS-responding post-processing circuit to provide accurate power measurement. Because the envelope signal is represented in the logarithmic domain, the square-law function required for RMS conversion can be accomplished by scaling the envelope signal by an appropriate factor before introducing it into a translinear loop in the RMS post-processing circuit.

22 Claims, 11 Drawing Sheets

OTHER PUBLICATIONS

AD640 DC-Coupled Demodulating 120MHz Logarithmic Amplifier, Dec. 1999, pp. 1-16, Analog Devices, Inc. Norwood, MA, US.

All Schottky Diodes are Zero Bias Detectors, Application Note 988, 1982, Hewlett-Packard Co., US.

Kitchen and Counts, RMS to DC Conversion Application Guide, 2nd Edition, 1986, Analog Devices, Inc., Norwood, MA, US.

Upham, Millimeter-wave detectors extend range of scalar network analyzer—the HP 8757A Scalar Network Analyzer—technical, Hewlett-Packard Journal, Apr. 1988, US.

Aparici, A Wide Dynamic Range Square-Law Diode Detector, IEEE Transaction on Instrumentation and Measurement, vol. 37, No. 3, Sep. 1988, pp. 429-433.

AD8306 5 MHz-400 MHz 100 dB High Precision Limiting-Logarithmic Amplifier, Aug. 1999, Analog Devices, Inc., Norwood, MA, US.

AD8309 5 MHz-500 MHz 100 dB Demodulating Logarithmic Amplifier with Limiter Output, Aug. 1999, Analog Devices, Inc., Norwood, MA, US.

AN-268 RMS-to-DC Converters East Measurement Tasks, 2009, Analog Devices, Inc., Norwood, MA, US.

AD536A Integrated Circuit True RMS-to-DC Converter, Mar. 2006, Analog Devices, Inc., Norwood, MA, US.

AD636 Low Level, True RMS-to-DC Converter, Nov. 2006, Analog Devices, Inc., Norwood, MA, US.

AD637 High Precision, Wideband RMS-to-DC Converter, Apr. 2007, Analog Devices, Inc., Norwood, MA, US.

WNW OFDM Waveform Enhancements for Small Form Factor Radios, 2007, L-3 Communications Nova Engineering, West Chester, OH, US.

Square Law Diode Detectors in 50 ohm Systems, 2007, http://epic.mcmaster.ca.

Radio receiver amplitude modulation(AM) demodulations, 2007, www.radio-electronics.com.

Introduction to Amplitude Modulation (AM) and Single sideband Suppressed Carrier Modulation (SSB), 2007, www.years.org.

U.S. Appl. No. 12/111,906, filed Apr. 29, 2008.

U.S. Appl. No. 12/429,077, filed Apr. 23, 2009.

* cited by examiner (1) IDEAL ABSOLUTE-VALUE FUNCTION
(2) OPTIMIZED FOR SQUARING
(3) OPTIMIZED FOR ABSOLUTE VALUE DETECTION

LOGARITHMIC AMPLIFIER WITH RMS POST-PROCESSING

CROSS-REFERENCE TO RELATED APPLICATIONS

This application claims priority from U.S. Provisional Patent Application Ser. No. 61/048,893 having the same title and filed Apr. 29, 2008 which is incorporated by reference.

BACKGROUND

Root-mean-square (RMS) is a fundamental measure of a signal's magnitude. The RMS value represents the amount of power the signal can deliver to particular load. Although numerous techniques have been devised for measuring the RMS value of a signal, the most practical and accurate solutions for electronic signal processing systems involve computational circuits that implement mathematically rigorous RMS functions. In these circuits, the input signal is squared and filtered to extract the root-mean value, and then an implicit or explicit square-root operation is performed to complete the RMS measurement.

FIG. 1 illustrates an example of a computational RMS-to-DC converter system. This system is embodied in commercial devices such as the AD536 and AD637 and described in the background of U.S. Pat. No. 6,429,720, which is by one of the same inventors of this patent disclosure and incorporated by reference. The dynamic range of the RMS subsystem is extended by arranging it in an automatic gain control (AGC) loop in which the RMS output signal $V_{RMS}$ is compared to a reference signal $V_{REF}$ by an operational amplifier 14. The resulting output signal $V_{OUT}$ is scaled and fed back to the gain control input $V_G$ of a variable gain amplifier (VGA) 13 which drives the input $V_1$ of the RMS subsystem. These robust systems can be arranged to provide highly accurate RMS-to-DC conversion over a wide dynamic range, regardless of the input signal waveform, at frequencies up to several MHz.

Measuring the true RMS value of a higher frequency signal, however, is more difficult because the precision techniques utilized in the computational solutions described above have limited bandwidth. Thus, designers often resort to more rudimentary, but less accurate, circuits for measuring the RMS values of radio frequency (RF) signals. One such circuit is illustrated in FIG. 2 which shows a widely used diode detector for measuring the strength of an RF signal. The input is applied to diode D1 which charges capacitor C1 to almost the peak voltage of the RF signal. A termination resistor $R_{TERM}$ may be included at the input, and another resistor R1 is typically placed in parallel with C1 to set the time constant for the rate at which the capacitor voltage decays. Alternatively, a small pull-down current may be connected to the cathode of the diode for a similar reason.

The simplicity of this circuit allows it to operate at the highest frequencies that can be handled by the underlying semiconductor technology. Unfortunately, the accuracy of the output $DC_{OUT}$ is highly dependent on both the magnitude and the waveform of the input signal. At very low input signal levels, typically less than a few hundred millivolts, the circuit of FIG. 2 can actually provide a semblance of square-law or power response due to the relatively high curvature of the diode's logarithmic response at these voltage levels as shown in FIG. 3. This region of operation is sometimes referred to, imprecisely, as the "square law" or "RMS" region because the curvature of the response, influenced by the exponential diode characteristic, approximates a square law to a certain extent, and therefore, provides a modicum of RMS response.

At higher input levels, however, the circuit behaves as a peak detector (or envelope-following detector, depending on the value of R1) providing a linear measure of the peak or rectified average voltage of the RF input signal. Thus, the accuracy of the circuit of FIG. 2 is highly susceptible to variations in the input waveform. The output may be calibrated for a given waveform, e.g., a pure sinusoid, but then the circuit will only provide a relative measure of the amplitude of non-sinusoidal waveforms, rather than a true RMS value.

FIG. 4 illustrates another type of prior art detector known as a logarithmic amplifier (log amp). Log amps are widely used to convert signals having wide dynamic range into signals having smaller dynamic range. Such conversions are useful, for example, in wireless communication systems where a handset may receive a very strong RF signal when the user is close to a base station, but an extremely weak signal when the user moves away from the base station. The type of log amp illustrated in FIG. 4 is a demodulating progressive compression log amp which has a series of cascaded gain stages 10, and a series of rectifying detector cells 12, each cell being connected to a corresponding gain stage. The outputs of the detector cells are in current form, so they can be simply added and filtered to generate the log output signal.

Demodulating log amps can be used to provide a measure of the strength of wide-range RF signals. For example, the summed outputs from the transconductance detector cells 12 may be applied to a resistor which converts the current into a voltage $V_{RSSI}$ for use as a received signal strength indicator (RSSI). In wireless communications, the RSSI is indirectly used to control the power transmitted by the handset as well as the power transmitted by the base station for that channel.

The log amp illustrated in FIG. 4 can provide wide dynamic range and bandwidth, as well as high accuracy, through careful attention to implementation details. This wide dynamic range can be maintained even at high frequencies because the dynamic range is distributed over many stages, each having relatively low gain, to achieve the logarithmic function through the process of progressive compression.

Although a demodulating log amp as described above can provide a useful measure of the signal strength, it does not provide an accurate measure of the true power of the input signal. Instead, it only represents the amplitude of the fluctuating envelope of the RF input. Moreover, as with the diode detector of FIG. 2, the output of the log amp of FIG. 4 is highly dependent on the waveform of the input signal. However, in RF power measurement, it is the waveform of the envelope that may be variable.

This waveform dependency of diode detectors and log amps discussed above is less problematic in analog communication systems because the RF waveforms may be described as "well-behaved" and are nearly sinusoidal. However, the on-going transition to digital communication systems raises the need for data encoding techniques that frequently result in signals having complex waveforms and large crest factors, that is, the ratio of peak-to-RMS. These signals place greater demands on RMS detectors.

FIG. 5 illustrates a prior art system capable of measuring the true RMS values of RF signals having complex waveforms over wide dynamic ranges. The circuit of FIG. 5 includes a pair of squaring cells arranged to implement the "difference of squares" function, which is a mathematically accurate implementation of the RMS function. See, Barrie Gilbert: "Novel Technique For R.M.S.—D.C. Conversion Based On The Difference Of Squares," *Electronics Letters*, 17 Apr. 1975, Vol. 11, No. 8, pp. 181-182, in which the error signal corresponding to $I_{ERR}$ is generated by a single analog multiplier, generating $(x-y)(x+y)=x^2-y^2$.

The input signal $S_{IN}$ is applied to the first squaring cell 16 which generates a squared signal $I_{SQR}$. A second input signal $S_{REF}$ is applied to the second squaring cell 18 which generates the squared signal $I_{REF}$. A nulling circuit 19 generates $V_{OUT}$ in response to the integrated error between $I_{SQR}$ and $I_{REF}$. The circuit of FIG. 5 can be configured for operation in a measurement mode, in which case $V_{OUT}$ is fed back to the second squaring cell as $S_{REF}$. Alternatively, the system can be configured in a controller mode, in which case $S_{OUT}$ is used to control the gain of a device such as a power amplifier. In this mode, a sample of the output from the power amplifier is fed back to the first squaring cell as its input signal $S_{IN}$, and a set-point target is applied to the second squaring cell as $S_{REF}$. In all these modes, the feedback loop servos the system until the mean value of $I_{SQR}$ equals $I_{REF}$.

If the squaring cells are implemented as simple transistor cells such as those disclosed in U.S. Pat. Nos. 6,204,719 and 6,172,549, which are by one of the same inventors as this patent disclosure and incorporated by reference, the system of FIG. 5 can provide a precise measure of the RMS value of RF signals for arbitrary waveforms. But even with this configuration, the accuracy deteriorates at very high operating frequencies, because the squaring cell 16 operates directly at the full RF frequency, and over the full dynamic range. Squaring cells, especially those based on transconductance (gm) cells, tend to have fairly small dynamic range because, at low input signal levels, their square-law behavior is very shallow and therefore lacks sensitivity, while at high input levels, the response curves progressively depart from a true square-law response.

To improve the dynamic range of the overall system, a variable gain amplifier (VGA) may be included at the input of the first squaring cell and arranged in an AGC feedback loop in a manner similar to that shown in the system of FIG. 5. In measurement mode, the output $V_{OUT}$ is also used as the gain control signal $V_G$. A set-point voltage is applied to the second squaring cell as $V_{REF}$. In this configuration, the circuit servos to maintain the RMS value at the input to the first squaring cell at the same value as $V_{REF}$.

By setting $V_{REF}$ to a value that corresponds to a part of the squaring cell response curve having a large amount of curvature, the sensitivity to low input signals can be increased, and the dynamic range over which the first squaring cell must operate can be reduced. However, the squaring cell is still forced to operate over a large dynamic range. Moreover, the squaring function is inherently demanding because it doubles the dynamic range of the squared signal. That is, taking the square of a signal having a 40 dB range results in a squared signal having an 80 dB range. Maintaining this level of performance is extremely difficult at high operating frequencies.

SUMMARY

A circuit includes a log amp to generate an envelope signal in response to an RF input signal, and a translinear post-processing circuit coupled to the log amp to provide a measure of the envelope signal to extract an RMS value of the RF input signal. The translinear post-processing circuit includes devices in a translinear loop having exponential characteristics. A method includes generating a compressed envelope signal using a logarithmic amplifier in response to an RF input signal, and post-processing the envelope signal to provide a decompressed measure of the power represented by the envelope signal to extract an RMS value of the RF input signal using a translinear post-processing circuit. The post-processing of the envelope signal includes applying the envelope signal to devices in a translinear loop having exponential characteristics.

DETAILED DESCRIPTION

Envelope Detector With Post-Envelope Statistics Extraction

Figure 6:
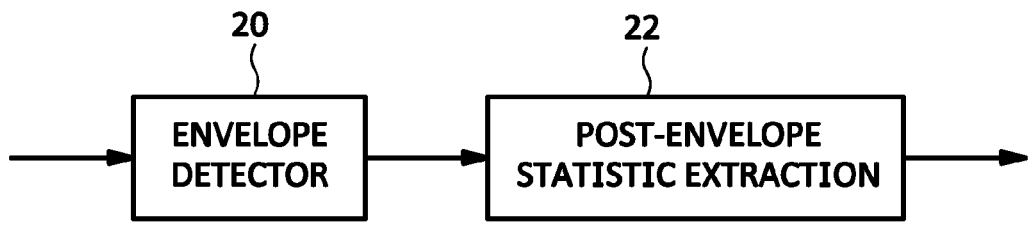
FIG. 6 illustrates an embodiment of a measurement system according to some of the inventive principles of this patent disclosure.

FIG. 6 illustrates an embodiment of a measurement system according to some of the inventive principles of this patent disclosure. The system of FIG. 6 includes an envelope detector 20 to rectify and low-pass filter the RF input signal. The resulting baseband envelope signal is then applied to a post-envelope statistics extraction circuit 22, which can be implemented with any number of lower-frequency precision measurement technologies because the high-frequency carrier portion of the signal has been removed, and thus, the demands on the post-envelope extraction circuit are greatly reduced.

The principles embodied in FIG. 6 establish a fundamental solution that enables countless different approaches to implementation techniques, and to the solution of various measurement problems. Thus, neither the envelope detector nor the post-processing circuit are limited to any specific realizations, although some particularly valuable implementations are described below. Examples of suitable envelope detectors include diode detectors, mixers, squaring cells, absolute value circuits, logarithmic amplifiers, etc. Examples of functions that may be implemented by the statistics extraction circuit include RMS, average, peak, mean, peak-to-average, crest factor, etc.

Moreover, these fundamental principles may be applied to novel combinations of conventional circuits to achieve greater performance and advantages than would otherwise be possible with the individual circuits. For example, in one embodiment, the envelope detector may be implemented as the diode detector of FIG. 2 with the combination of C1 and R1 tuned to provide a suitable time constant for extracting the modulation envelope from the carrier signal. The post-processing circuit can then be implemented as a precision RMS sub-system such as that illustrated in FIG. 1. The resulting system provides greater accuracy and dynamic range than could be obtained with the diode detector, while operating at much higher frequencies than could be accommodated by the RMS sub-system alone.

Figure 7:
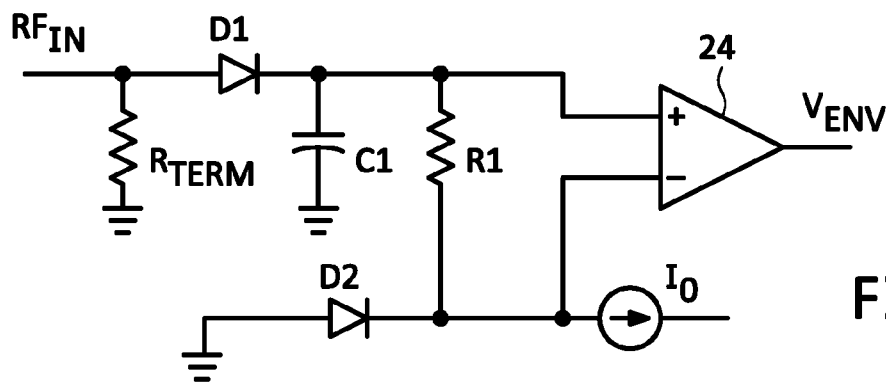
FIG. 7 illustrates an example implementation of the envelope detector of FIG. 6 according to some of the inventive principles of this patent disclosure.

FIG. 7 illustrates an embodiment of a diode detector having improved sensitivity according to some additional inventive principles of this patent disclosure. Diode D1 is arranged to receive the input signal $RF_{IN}$ and charge a capacitor C1 which decays at a rate determined by resistor R1. The values of C1 and R1 are adjusted to eliminate the carrier portion of the RF input over the anticipated operating frequency range. The extracted envelope signal is applied to an amplifier 24, preferably an instrumentation quality amplifier having a defined gain, to provide the final envelope signal $V_{ENV}$ for post-processing.

To eliminate the low sensitivity in the low conduction region of the response curve of D1, a second diode D2, which matches D1 and is biased by a current $I_0$, is included to maintain the non-inverting (+) input of the amplifier at a negative voltage. The circuit parameters are preferably adjusted so that the current through D1 at zero input voltage is less than or equal to $I_0$. The use of high-frequency Schottky diodes may further improve the operation of the circuit.

Some additional inventive principles relate to intermediate processing of the envelope signal prior to post-processing. For example, in the embodiment of FIG. 8, the envelope signal may be routed through one of three different paths that provide various types of intermediate processing prior to the post-processing section.

Figure 9:
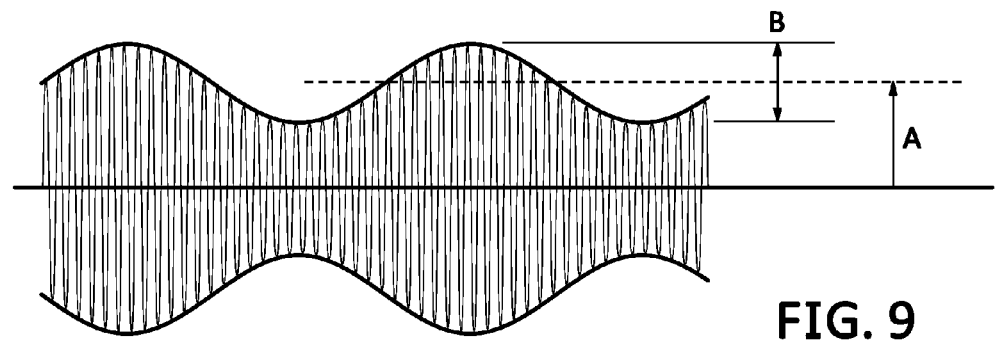
FIG. 9 illustrates an amplitude modulated carrier signal for explaining the operation of the system of FIG. 8.

The "A+B" path couples the envelope signal directly to the post-envelope statistics extraction circuit. The term "A+B" refers to the entire modulation envelope as shown in FIG. 9. The amplitude modulated signal illustrated in FIG. 9 includes an RF carrier signal that is modulated by the baseband signal to provide the modulation envelope. The modulation envelope may be described as having two components: the "A" component which is a DC or quasi-DC value related to the unmodulated carrier amplitude; and the "B" component which includes the information in the modulating signal and is related to the modulation index or depth. Thus, the "A+B" path couples the entire modulation envelope, including both the "A" and "B" components, directly to the post-processing circuit.

Figure 8:
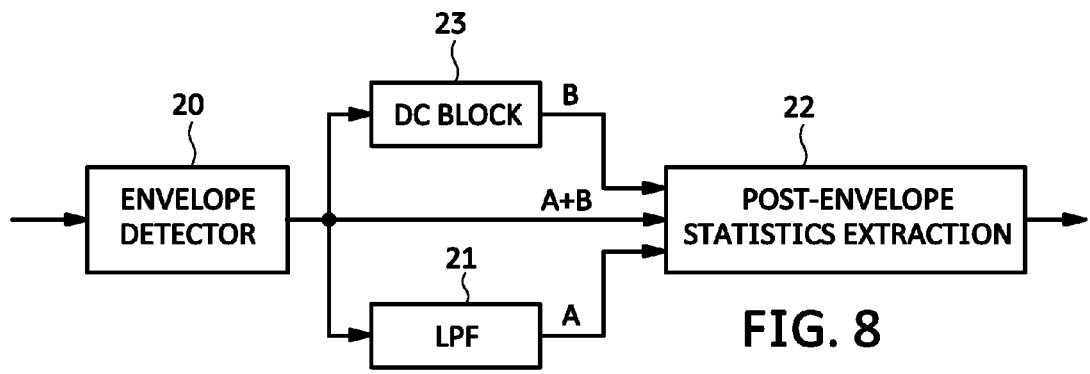
FIG. 8 illustrates an embodiment of a measurement system having intermediate processing according to some of the inventive principles of this patent disclosure.

The "A" path includes a low pass filter 21 that removes the "B" component, thereby presenting just the "A" component to the post-processor. In contrast, the "B" path includes a DC blocking circuit 23 to remove the "A" component and present just the "B" component to the post-processor. Thus, the embodiment of FIG. 8 provides a flexible system for measuring various combinations of signal components extracted by the envelope detector.

Log Amp With RMS Post-Processing

Figure 10:
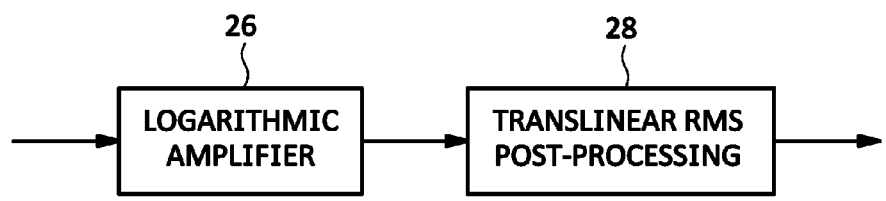
FIG. 10 illustrates another embodiment of a measurement system according to some of the inventive principles of this patent disclosure.

Some additional inventive principles of this patent disclosure relate to post-processing the output of a log amp to provide true RMS response or other signal statistics. Referring to FIG. 10, an envelope detector is realized as a logarithmic amplifier 26, and RMS post-processing is performed by a circuit 28 that utilizes translinear principles to extract a mathematically derived measure of the power represented by the demodulated envelope signal. By using a log amp as the envelope detector, the intermediate signal is applied to the RMS post-processing section in the logarithmic domain, which is "native" to a translinear circuit. This enables mathematically robust processing because translinear circuits are known for their ability to perform precision mathematical operations over many decades of signal range.

Moreover, because exponentiation (e.g., squaring) in the linear domain corresponds to multiplication in the logarithmic domain, the inventive principles enable a squaring function to be implemented by simply taking a signal represented in logarithmic form and multiplying it by a factor of two. Since the squaring function is critical to accurate power measurement, the embodiment of FIG. 10 enables myriad solutions wherein the envelope of the measured signal is converted to the logarithmic domain, and then scaled (multiplied) by a suitable scaling factor to effect the squaring operation in the translinear post-processing section.

The translinear post-processing circuit 28 encompasses not only strictly translinear circuits, i.e., loops of junctions, but also refers to circuits that utilize translinear principles in the broader sense of exploiting the exponential characteristics of BJTs or other devices having an exponential mode of operation. See, Barrie Gilbert, Translinear Circuits: An Historical Overview, *Analog Integrated Circuits and Signal Processing*, 1996, pp. 95-118, Kluwer Academic Publishers, Boston, Mass.

Although the inventive principles are not limited to a particular type of logarithmic amplifier, the use of a demodulating progressive compression log amp combined with a translinear RMS post-processing section provides a particularly attractive and robust power measurement solution. The log amp front end accurately converts a wideband RF input signal having complex modulation waveforms and wide dynamic range to a well-behaved baseband envelope signal. The RMS post-processing section enables accurate and mathematically rigorous RMS conversion of the envelope signal at a lower frequency. Because the log amp presents the envelope signal to the RMS section in a logarithmic form as an integral part of the demodulation process, the squaring function can be implemented through simple multiplication in the logarithmic domain, thereby eliminating the need to operate a traditional squaring cell at full RF frequencies.

Figure 11:
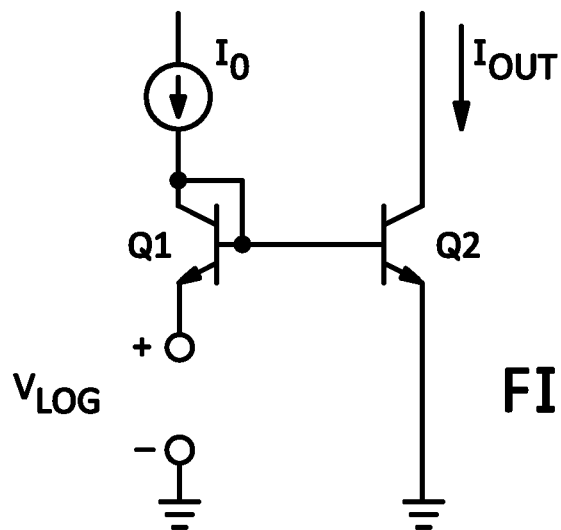
FIG. 11 illustrates an example implementation of a translinear post-processing circuit according to some of the inventive principles of this patent disclosure.

FIG. 11 illustrates a simple embodiment of an RMS post-processing circuit according to some inventive principles of this patent disclosure. The input signal $V_{LOG}$, which is a logarithmic representation of the envelope of the measured signal, is applied as a voltage to the emitter of a diode-connected transistor Q1 which is biased by a current $I_0$. The combined voltage across Q1 and $V_{LOG}$ is imposed across the base-emitter junction of a transistor Q2. Invoking translinear principles, and assuming the junctions of Q1 and Q2 are reasonably well matched, the collector current $I_{OUT}$ through Q2 is as follows:

$$I_{OUT} = I_0 \exp\left(\frac{V_{LOG}}{kT/q}\right) \quad \text{(Eq. 1)}$$

Returning to the input signal $V_{LOG}$, the standard expression for the response of a logarithmic amplifier is:

$$V_{LOG} = V_Y \log(V_{IN}/V_Z) \quad \text{(Eq. 2)}$$

where $V_{LOG}$ is the output voltage, $V_{IN}$ is the input voltage, $V_Y$ is the slope voltage, and $V_Z$ is the intercept voltage. Substituting Eq. 2 into Eq. 1 yields:

$$I_{OUT} = I_0 \exp\left(\frac{V_Y \log(V_{IN}/V_Z)}{kT/q}\right) \quad \text{(Eq. 3)}$$

which may be rearranged as follows, where the thermal voltage $V_T = kT/q$:

$$I_{OUT} = I_0 \exp\left(\frac{V_Y}{V_T} \log\left(\frac{V_{IN}}{V_Z}\right)\right) \quad \text{(Eq. 4)}$$

As mentioned above, a beneficial aspect of working with signals in the logarithmic domain is that exponentiation in the linear domain corresponds to multiplication in the logarithmic domain, thus $a \cdot \log(b) = \log(b^a)$. Applying this identity to Eq. 4 yields:

$$I_{OUT} = I_0 \left(\frac{V_{IN}}{V_Z}\right)^{\frac{V_Y}{V_T}} \quad \text{(Eq. 5)}$$

By setting $V_Y/V_T = 2$ through proper scaling of the slope voltage $V_Y$, a squaring function can be realized. Thus, where a signal would normally be represented in logarithmic form as $V_{LOG}$, the signal can be squared by simply multiplying it by two and applying the resulting signal $2V_{LOG}$ to the input of an anti-log circuit. Viewed this way, the circuit of FIG. 11 can be seen as an anti-log (or exponentiation, decompression, etc.) circuit to restore the signal to the linear domain after squaring is accomplished through multiplication in the logarithmic domain.

Depending on the implementation of the log amp that provides the input signal $V_{LOG}$, the embodiment of FIG. 11 may create a synergistic effect in which temperature dependencies in the log amp are automatically canceled by the presence of the temperature dependency ($kT/q$) in Eq. 5. For example, in a demodulating progressive compression log amp, there may be a $kT/q$ dependency associated with the transistors in the detector cells. Efforts are usually made to compensate for this inherent temperature dependency so as to stabilize the slope with temperature. However, if such a log amp is used in conjunction with the anti-log circuit of FIG. 11, the temperature dependency in the anti-log circuit works in harmony with, rather than attempting to defeat, the inherent temperature dependencies in the log amp, thereby providing automatic temperature compensation. Thus, PTAT (proportional to absolute temperature) currents, which are generally preferred in integrated circuits, can be used throughout the entire log amp structure. As a further benefit, the use of PTAT currents may eliminate the need to apply DC offsets at the output to compensate for the temperature dependency of the intercept voltage caused by the $2kT/q$ knee voltage in the limiter stages.

Although the circuit of FIG. 11 is not strictly a complete RMS solution, it implements the squaring function which is typically the most difficult aspect of measuring true power and, in some applications, provides an acceptable measure of power.

Figure 12:
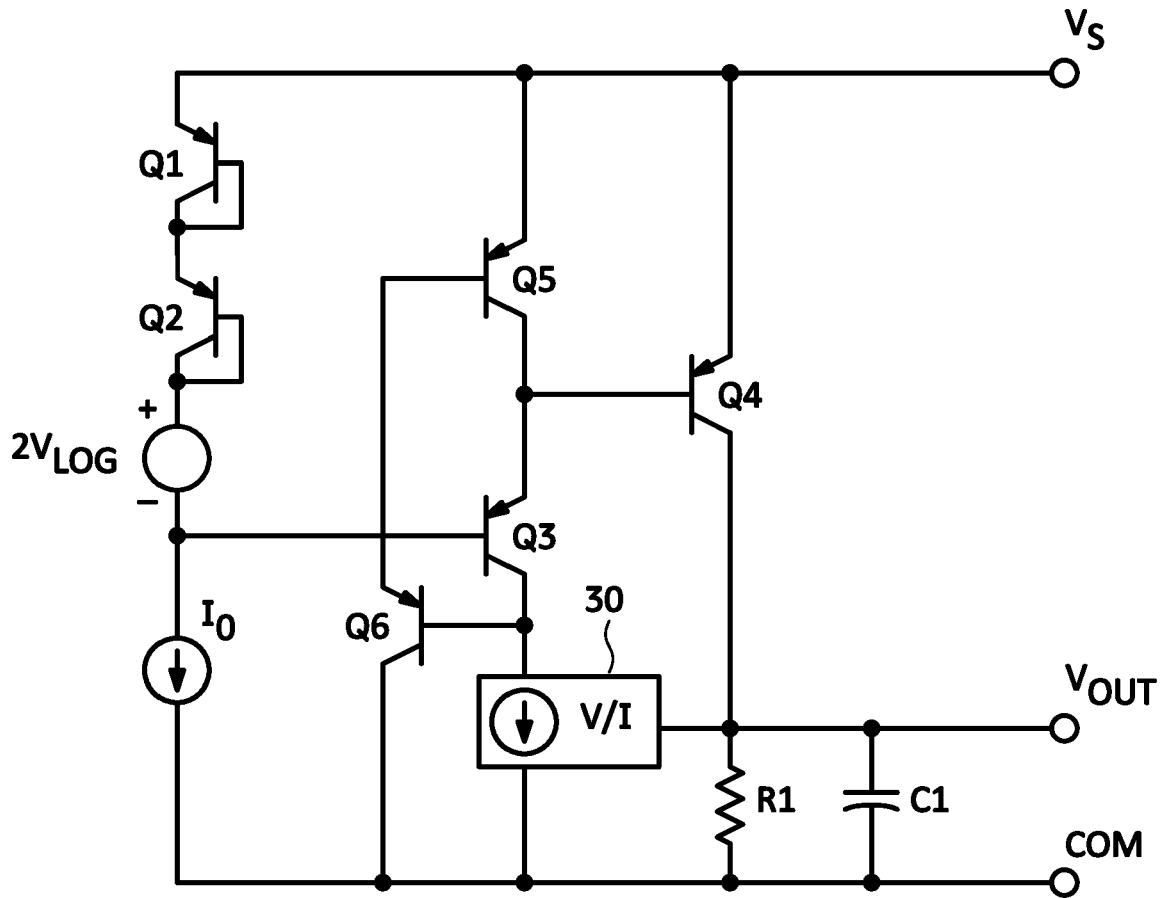
FIG. 12 illustrates another example implementation of a translinear post-processing circuit according to some of the inventive principles of this patent disclosure.

FIG. 12 illustrates another embodiment of an RMS post-processing circuit that implements a more complete RMS solution according to some inventive principles of this patent disclosure. The scaled output from a logarithmic amplifier is applied as the input to the circuit in the form of a voltage $2V_{LOG}$ in series with diode-connected transistors Q1 and Q2 which are forced to operate at a constant current $I_0$. In the absence of any applied log input signal, and assuming transistor Q3 is operating at a constant current, Q1 and Q2 set up a quiescent current in transistor Q4 through the translinear loop formed by Q1, Q2, Q3 and Q4. As a properly scaled amount of logarithmic signal is applied at the input, and assuming Q3 continues to operate at a constant current, the current through Q4 provides a square-law output which is filtered by the combination of R1 and C1 to extract the average (mean-square) signal. However, a voltage-to-current (V/I) converter 30 closes a feedback loop around Q3 and forces it to operate, not at a constant current, but at a current that is proportional to the averaged output voltage $V_{OUT}$, thereby providing an implicit square-root function. That is, the embodiment of FIG. 12 operates as a squarer-divider with an averaging filter to provide a complete RMS (root-mean-square) measure of power in which the output is converted back to the linear domain.

Figure 13:
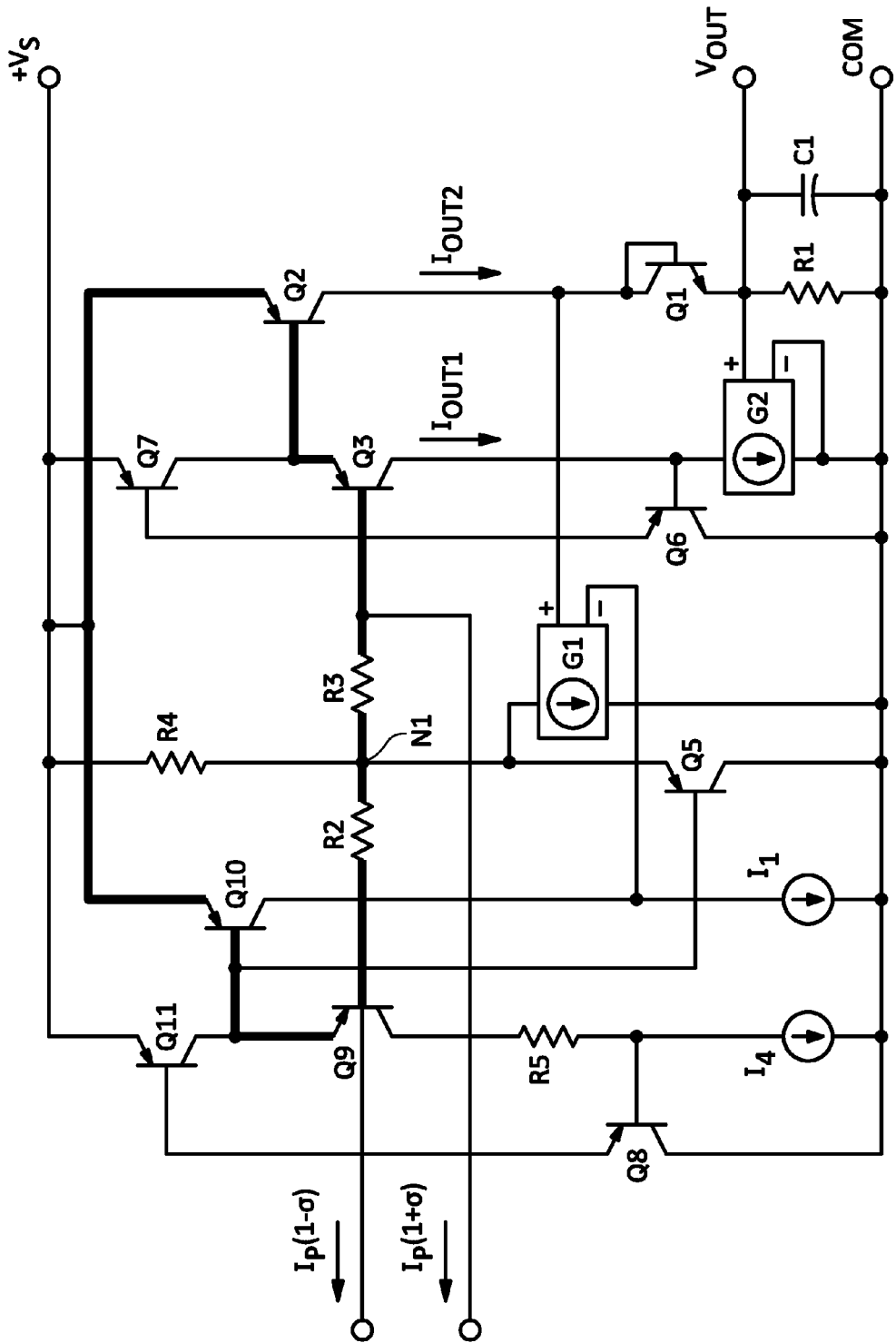
FIG. 13 illustrates an additional example implementation of a translinear post-processing circuit according to some of the inventive principles of this patent disclosure.

FIG. 13 illustrates another embodiment of an RMS post-processing circuit according to some inventive principles of this patent disclosure. In the embodiments of FIGS. 11 and 12, the logarithmic input signal is shown being applied to the circuit as an ideal voltage source with no offset, which may be inconvenient to implement in a practical circuit. In the embodiment of FIG. 13, however, the input signal is applied as a differential current $I_P(1-\sigma)$, $I_P(1+\sigma)$, where $\sigma = \log(V_{IN}/V_Z)$. A differential current in this form may be generated, for example, by a demodulating progressive compression log amp having full-wave detectors that generate a standing or "pedestal" current $I_P$ that is modulated by the logarithmic signal σ. Thus, σ is assumed to be a logarithmic representation of some measured signal, e.g., the envelope of a modulated RF signal with the carrier removed.

The basic operation of the circuit of FIG. 13 is as follows. The differential input currents $I_P(1-\sigma)$, $I_P(1+\sigma)$ create a differential voltage across resistors R2 and R3 which introduces a $\Delta V_{BE}$ into what would otherwise be a strict translinear loop (shown with heavier lines) through Q9, Q10, Q2 and Q3. The $\Delta V_{BE}$ is essentially transported to the base of Q2 which generates an output current $I_{OUT2}$. By scaling R2 and R3 appropriately (being mindful of kT/q, and temporarily neglecting the portion of the input signal attributed to the pedestal current $I_P$), the $\Delta V_{BE}$ can be made to correspond to a slope of 2 in the logarithmic domain. Transistor Q2 performs a transformation back to the linear domain, and thus, $I_{OUT2}$ can be viewed as a linear representation of the square of the input signal (assuming the current through Q3 is constant). Capacitor C1 performs the averaging (mean) function on $I_{OUT2}$, and transconductance cell G2 completes a feedback loop that provides implicit square-rooting by generating a current $I_{OUT1}$ in Q3 that is proportional to the average output voltage $V_{OUT}$.

A first refinement to the circuit of FIG. 13 is directed to neutralizing the effect of the pedestal portion of the differential input current $I_P(1-\sigma)$, $I_P(1+\sigma)$. The differential voltage across resistors R2 and R3 should ideally reflect only the logarithmic portion σ of the input signal. The pedestal portion introduces a DC offset that changes the scaling and mathematics of the translinear loop. Therefore, a resistor R4 is connected to the midpoint of resistors R2 and R3 at node N1 to absorb the standing or pedestal current. The value of R4 is chosen so that, when the logarithmic portion of the input is zero (σ=0), R4 provides enough current through R2 and R3 to cancel the pedestal current and balance the bases of Q9 and Q3 at the same potential. Any excess current is absorbed by Q5, which is arranged as an emitter follower, and/or a transconductance cell G1 as described below.

As a further refinement, G1 is arranged to maintain the collectors of Q10 and Q2 at the same voltage by pulling down on node N1 at the midpoint of R2 and R3, thereby compensating for low Early voltage and thermal effects. In this example, G1 should preferably have a high transconductance to minimize the voltage difference at the collectors of Q10 and Q2.

Unlike G1, where the transconductance may be arbitrarily high, the transconductance of G2 is preferably set to a precise value to provide a defined amount of feedback, thereby maintaining an accurate implicit square-rooting function.

A few other refinements include a diode-connected transistor Q1 which maintains the input terminals of G1 one $V_{BE}$ above $V_{OUT}$, and a resistor R5 which slightly decouples the collector of Q9 from the base of Q8 which is held two $V_{BE}$ below the power supply $V_P$.

The embodiment of FIG. 13 may be analyzed using translinear principles to further illuminate some of its features and benefits. Transistors Q2 and Q3 can be viewed as an output path, which, together with the input path comprising Q9 and Q10, form a global loop. Transistor Q10 operates at a fixed current $I_1$. The current through Q9 is held at a constant value $I_4$ by the ancillary loop arrangement of Q8 and Q11. Likewise, transistors Q6 and Q7 maintain the current through Q3 at the value of $I_{OUT1}$ which is set by G2.

Assuming transistors Q2, Q3, Q9 and Q10 have the same geometry, and the pedestal (standing) current through resistors R2 and R3 is properly canceled, the currents through the translinear loop may be written as $I_1 I_4 = I_{OUT1} I_{OUT2}$ when the logarithmic portion of the input signal is zero (σ=0). For a nonzero value of logarithmic input (σ≠0), the introduction of the $\Delta V_{BE}$ into the translinear loop (across R2 and R3) corresponds to an effective change of either the area ratio or current density, which is often written as λ:

$$I_1 I_4 = \lambda \cdot I_{OUT1} I_{OUT2} \qquad \text{(Eq. 6)}$$

Invoking translinear principles, and substituting $R_B$=R2+R3 for simplicity:

$$\lambda = \exp\left(\frac{I_P \sigma \cdot R_B}{V_T}\right) \qquad \text{(Eq. 7)}$$

Substituting Eq. 7 into Eq. 6, and recalling that $\sigma = \log(V_{IN}/V_z)$ yields:

$$I_1 I_4 = \exp\left(\frac{I_P R_B}{V_T} \cdot \log\frac{V_{IN}}{V_Z}\right) I_{OUT1} I_{OUT2} \qquad \text{(Eq. 8)}$$

Since $a \cdot \log(b) = \log(b^a)$, Eq. 8 may be rewritten as follows:

$$I_1 I_4 = \left(\frac{V_{IN}}{V_Z}\right)^{\frac{I_P R_B}{V_T}} I_{OUT1} I_{OUT2} \qquad \text{(Eq. 9)}$$

Through proper scaling, $I_P R_B/V_T$ may be set equal to two, thereby implementing a square law function. Since $I_1$ and $I_4$ are constants, and $I_{OUT1}$, which is in the implicit square-root feedback path, may be set to an accurately scaled representation of the average value of $I_{OUT2}$, the circuit of FIG. 13 may be arranged to provide a complete RMS computation.

Thus, the embodiment of FIG. 13 can be used in a two-step measurement process in which a log amp converts an RF input signal into a baseband envelope signal which is then applied to the translinear RMS circuit of FIG. 13 to extract an accurate measurement of the RMS value of the input signal. Further, since $I_P$ and $V_T$ appear in a reciprocal relationship in Eq. 9, $I_P$ can be implemented as a PTAT current to automatically cancel the temperature dependencies.

Peak-to-Average Ratio Measurement

Some additional inventive principles of this patent disclosure relate to peak-to-average ratio (PAR) measurements. Advanced data encoding and modulation techniques have made it possible to transmit ever increasing amounts of information through wireless communication systems. Accurate power measurement and control is critical to implementing these schemes. For example, code division multiple access (CDMA) systems rely on a coding scheme in which multiple users occupy the same part of the frequency spectrum, but to one user, signals from other users appear as noise. For such a system to work effectively, the transmitted power levels from individual handsets must be controlled so that the transmitted signals are received at the base station at about the same power level, regardless of how far each handset is from the base station. This places extreme demands on the power control system. Moreover, it is inherently difficult to measure the power of CDMA signals because the waveforms have very high peak-to-average ratios.

Another transmission technique known as orthogonal frequency division multiplexing (OFDM) relies on multiple orthogonal subcarriers. Each subcarrier has a relatively low amplitude, but since numerous subcarriers occasionally add in phase to create very high instantaneous amplitudes, the resulting OFDM waveforms have high peak-to-average ratios.

Systems utilizing modulation schemes with high peak-to-average ratios must often be operated in a condition known as "backoff" in which the output of the power amplifier is reduced to prevent distortion that occurs when the signal peaks exceed the linear range of the amplifier. Accurate peak-to-average ratio measurement is critical for implementing backoff control schemes.

Figure 14:
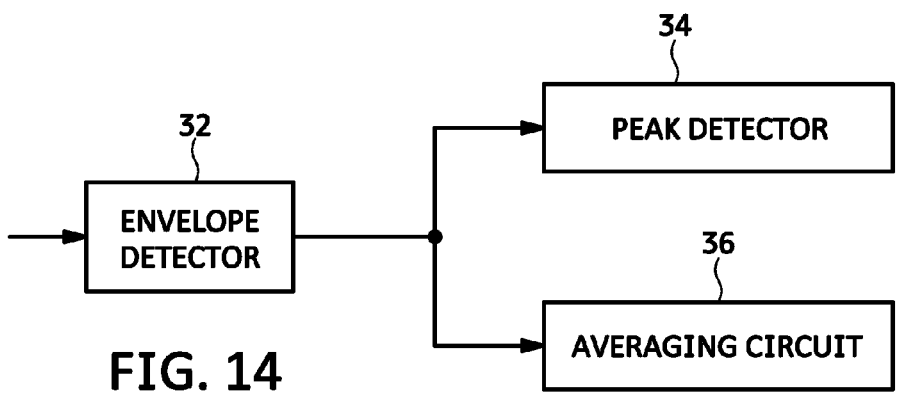
FIG. 14 illustrates an embodiment of a peak-to-average measurement system according to some of the inventive principles of this patent disclosure.

FIG. 14 illustrates an embodiment of a peak-to-average measurement system according to some of the inventive principles of this patent disclosure. The system of FIG. 14 includes an envelope detector 32 having a relatively short time constant to extract a modulation envelope from an input signal having a modulated carrier. A peak detector 34 is coupled to the envelope detector to measure the peak value of the modulation envelope. An averaging circuit 36 having a relatively long time constant measures the average value of the modulation envelop. In this context, average refers not only to a strictly mathematical average, but also to RMS or any other function that measures the signal with a relatively long time constant. Thus, in this context, the term peak-to-average also encompasses crest factor which is well established as the ratio of the peak value to the RMS value of a signal.

Figure 1:
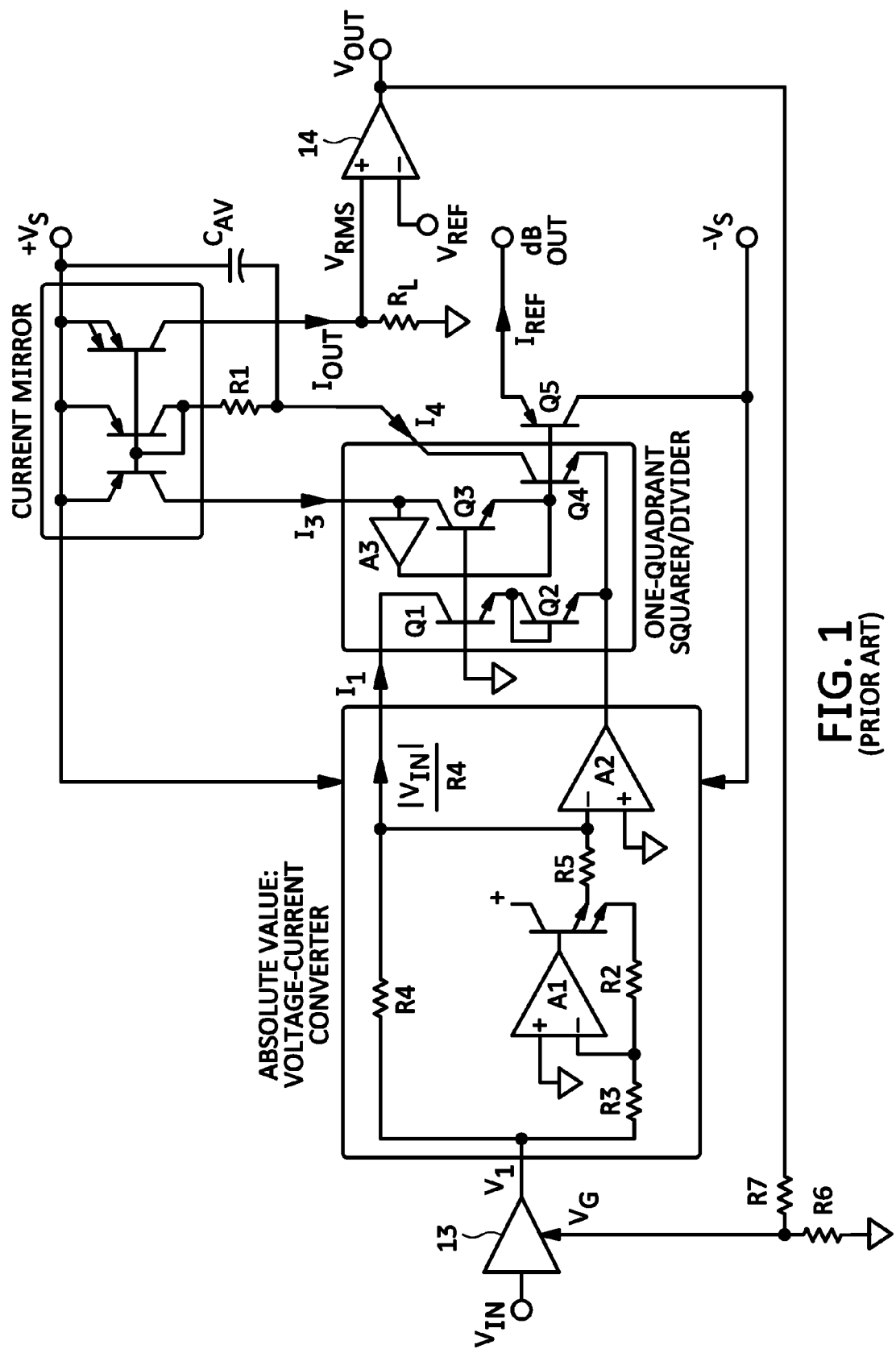
FIG. 1 illustrates a prior art precision RMS measurement system based on an implicit squarer/divider.
Figure 2:
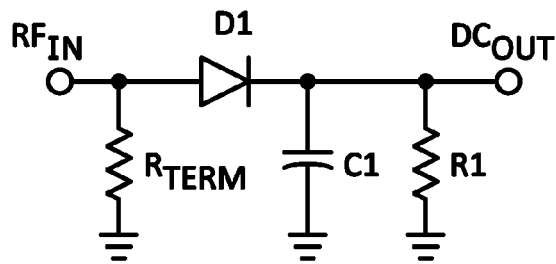
FIG. 2 illustrates a prior art diode detector.
Figure 3:
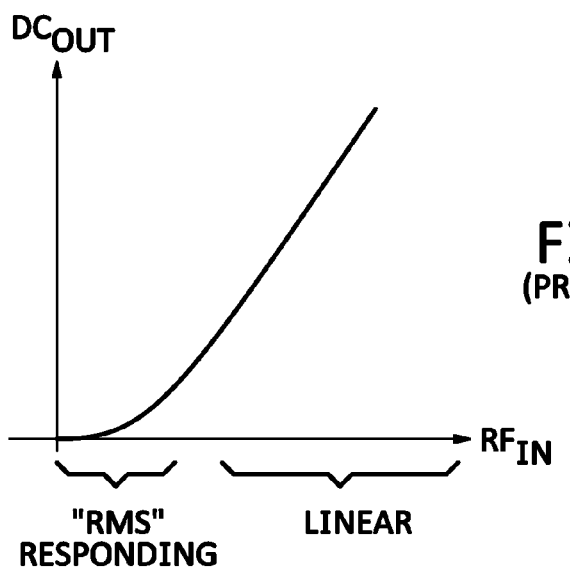
FIG. 3 illustrates the operational characteristics of the diode detector of FIG. 2.
Figure 4:
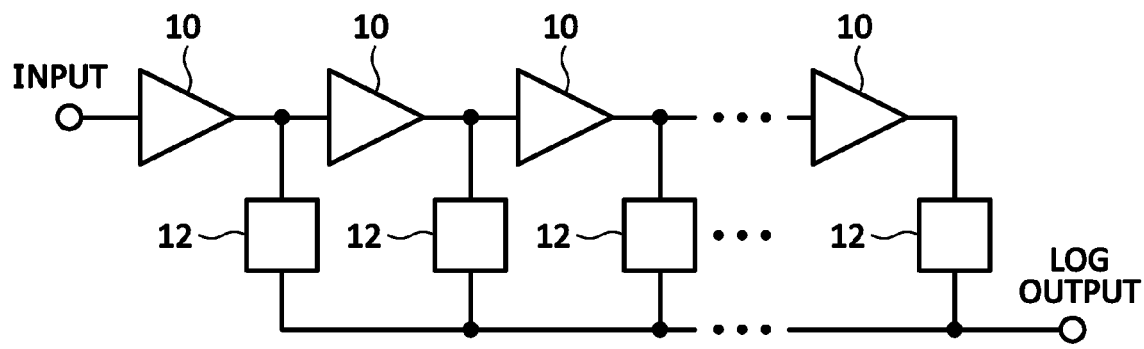
FIG. 4 illustrates a prior art progressive compression logarithmic amplifier.

As with other embodiments described above, the embodiment of FIG. 14 is not limited to any particular implementation details. For example, the peak detector may be implemented as a simple diode to charge a capacitor, or as a more sophisticated sample-and-hold system with MOS switches Likewise, the averaging circuit may be implemented as a simple RC low-pass averaging filter, or a sophisticated RMS subsystem as shown in FIG. 1. Alternatively, either or both of the peak and average detectors may be implemented with an ADC followed by fully digital computational logic. Analog outputs from the peak detector and averaging circuit may be followed by an analog ratiometric circuit to provide an analog measure of the PAR, or by an ADC for digital computation of the PAR.

Figure 5:
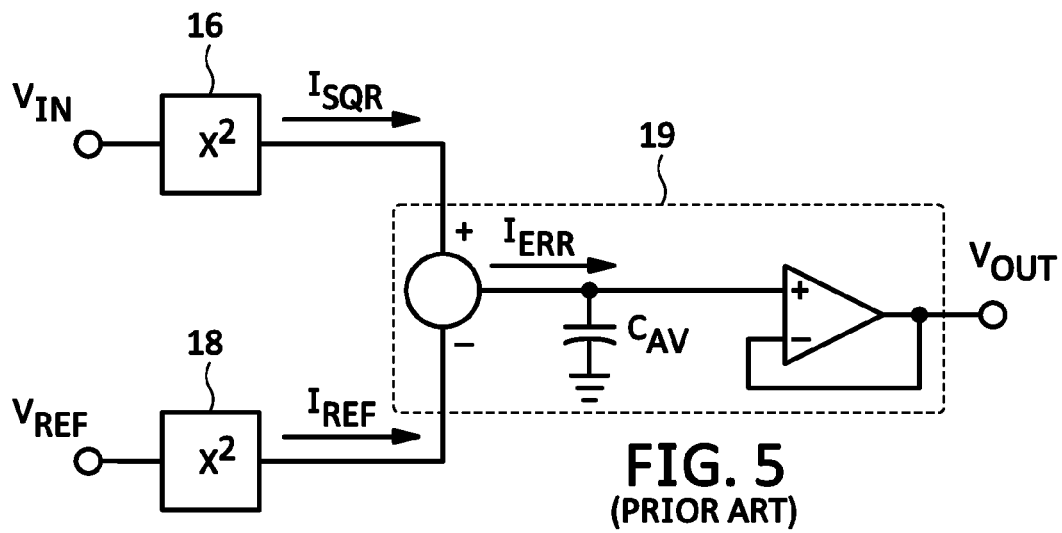
FIG. 5 illustrates a prior art RMS measurement system implementing the difference-of-squares function.

An advantage of using the same envelope pre-detector for both the peak and averaging circuits is that the identical signal is applied to both post-processors, so the relative scaling of both measurements is accurate. That is, the ratio, which is the essence of a PAR measurement, is largely insensitive to inaccuracies that may be present in the envelope detector. This tolerance for absolute scaling errors may enable the use of lower-cost, less accurate components than could otherwise be used because the relative scaling is more important. For example, whereas the transistor squaring cells described above in the context of FIG. 5 may not be acceptable to perform the complete RMS portion of a PAR computation in a single step, they may be adequate for use as an envelope pre-detector. Moreover, the principles embodied in the system of FIG. 14 may enable the use of inexpensive off-the-shelf components to rapidly create more accurate systems. Thus, one commercial square-law RMS detector may be arranged with a small capacitor to function as an envelope detector, followed by a second identical detector with a larger capacitor to perform the RMS measurement. Although such an embodiment may involve the use of two separate integrated circuits (ICs) as the square-law detectors, the ability to use two high-volume, low-cost commercial parts may result in a relatively low overall system cost in view of the performance gains.

Figure 15:
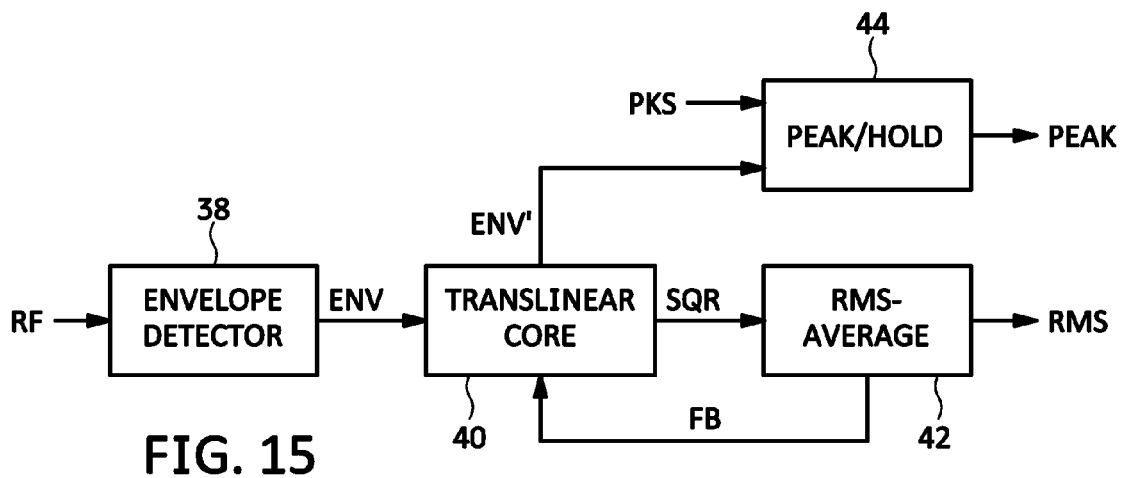
FIG. 15 illustrates another embodiment of a peak-to-average measurement system according to some of the inventive principles of this patent disclosure.

FIG. 15 illustrates another embodiment of a peak-to-average measurement system according to some of the inventive principles of this patent disclosure. The system of FIG. 14 includes an envelope detector 38 to extract an envelope signal ENV from the input signal RF. A translinear core 40 generates a second version of the envelope signal ENV' and a squared signal SQR in response to the first envelope signal ENV and a feedback signal FB from an RMS-average circuit 42. A peak/hold circuit 44 provides the output signal PEAK by transmitting or holding the envelope signal in response to a peak select signal PKS. The RMS averaging circuit 42 performs the averaging portion of the RMS function to provide the output signal RMS.

Figure 16:
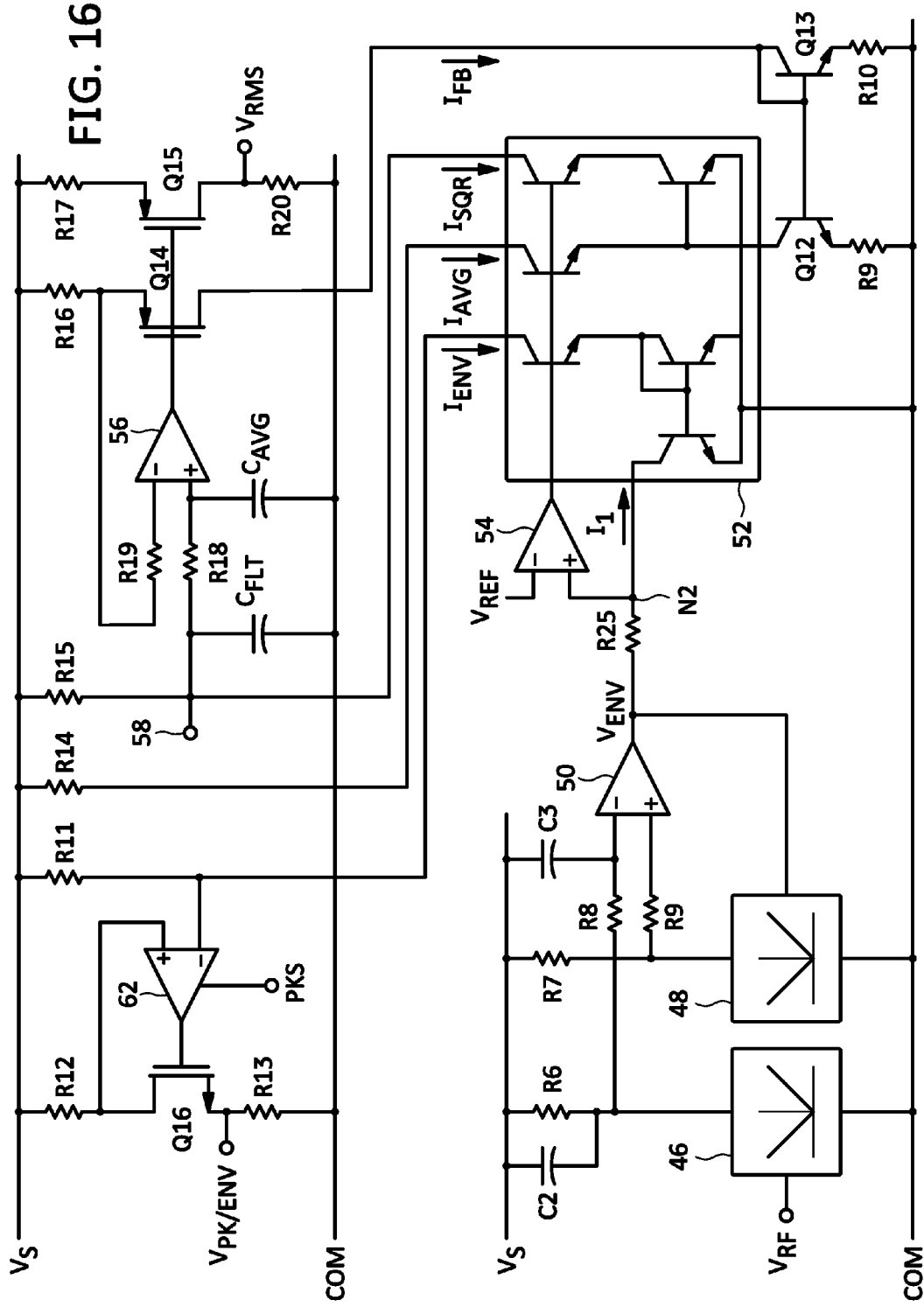
FIG. 16 illustrates a more detailed embodiment of a peak-to-average measurement system according to some of the inventive principles of this patent disclosure.

FIG. 16 is another embodiment of a peak-to-average measurement system that illustrates some examples of how the components of FIG. 15 may be implemented according to some of the inventive principles of this patent disclosure. The systems of FIGS. 14 and 15, however, are not limited to the specifics illustrated in FIG. 16.

In the embodiment of FIG. 16, the envelope detector is implemented as a dual detector cell configuration in which the envelope signal $V_{ENV}$ is extracted through a nulling process in which the input signal $V_{RF}$ is applied to a first detector cell 46, and the envelope signal $V_{ENV}$ is fed back to a second, identical detector cell 48. The detector cells are shown here as absolute value cells, but other types of detector cells may be used. The current outputs from the dual detector cells are converted to voltages by matched load resistors R6 and R7 and nulled by an operational amplifier (op amp) 50 which drives the envelope signal $V_{ENV}$ to whatever value is needed to equalize the detector cell outputs.

Figure 17:
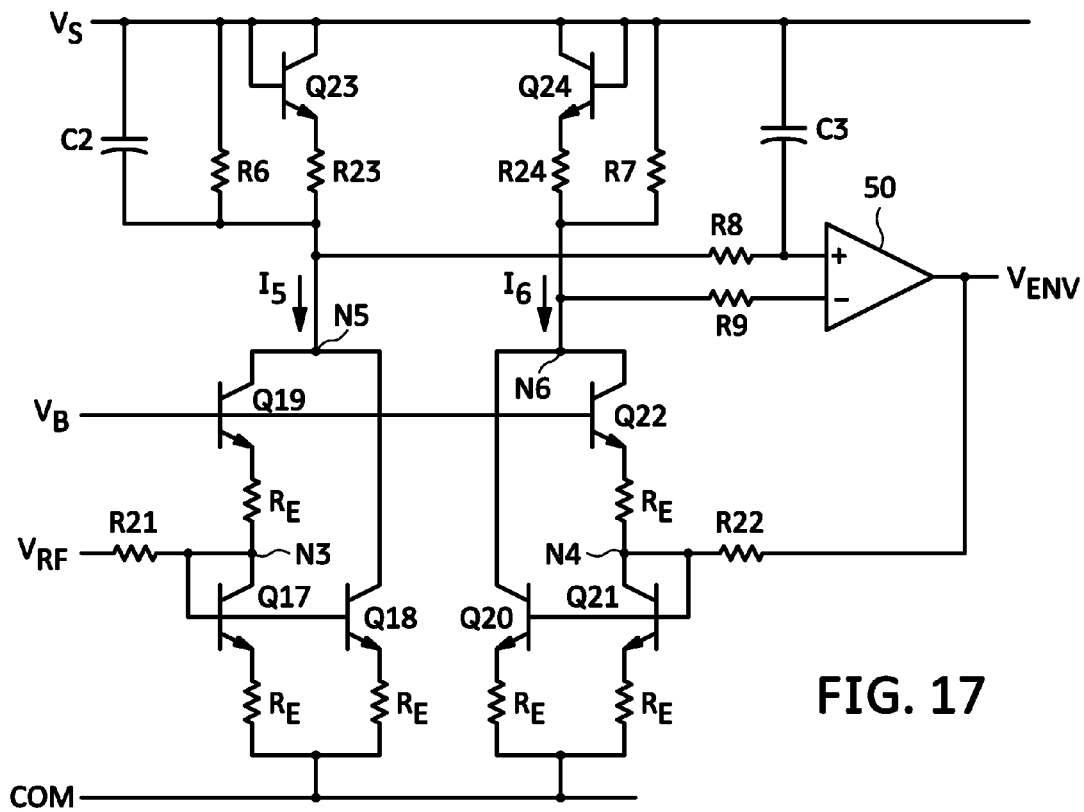
FIG. 17 illustrates a more detailed embodiment of an envelope detector according to some inventive principles of this patent disclosure.

The output of the first detector cell is a rectified high-frequency (HF) current at twice the frequency of the RF input signal. A capacitor C2 and resistor R6 (or alternatively, a non-linear load made up of R6, R23 and Q23 as shown in FIG. 17 and discussed below), provide a first pole for filtering the high-frequency (e.g., second harmonic) components from the output of the first detector cell (also referred to as the RF or HF detector cell). The combination of R8 and C3 provides a second pole for low-pass filtering the HF signal. The poles can be placed at any suitable place in the s-plane to set the overall averaging time constant for the envelope detector. In one example embodiment as described below, both poles may be placed at the same frequency, e.g., 100 MHz to provide a −40 dB slope in the magnitude of frequency response.

The filtered output from the RF cell is applied to the inverting (−) input of the op amp. The output of the second detector cell (also referred to as the DC or low frequency (LF) detector cell) is a quasi-DC current, and no filtering is required before it is applied to the noninverting (+) input of the op amp through resistor R9, which is preferably matched to R8. Thus, the output of the envelope detector is a quasi-DC voltage $V_{ENV}$ that follows the modulation envelope of the RF input signal.

The envelope signal $V_{ENV}$ is next converted to a current $I_1$ through resistor R25 and applied to a translinear core 52 which performs the mathematical processing for extracting the RMS value of the envelope signal. The translinear core generates currents $I_{ENV}$ and $I_{SQR}$ for further processing by the RMS-average and peak/hold sections of the circuit. A feedback signal is applied to the translinear core in the form of a current $I_{FB}$ through a current mirror that includes transistors Q12 and Q13. The operation of the translinear core will be described in detail below with reference to FIG. 19. However, a salient feature apparent from FIG. 16 is that op amp 54 drives the translinear core in such a manner as to maintain the potential of node N2 at the value $V_{REF}$. With node N2 anchored at a stable reference voltage (for example, a scaled version of the bias voltage VB described below), the current through R25 essentially depends only on the value of $V_{ENV}$, and thus, the current $I_1$ is applied to the translinear core as a highly linear representation of the envelope signal.

The current $I_{ENV}$ from the translinear core is essentially a mirrored version of the envelope signal $I_1$ that is reflected up to resistor R11 where it is converted to a voltage that is referenced to the positive power supply $V_S$ and applied to the (−) input of another op amp 62. Op amp 62 drives the gate of an NMOS transistor Q16 to force the current through R12 to equal the current through R11. The resulting current through Q16 also flows through ground-referenced resistor R13, thereby creating an output voltage $V_{PK/ENV}$ across R13.

Op amp 62 includes a peak-hold feature that is activated by a peak select signal PKS. When the peak select signal PKS is inactive, op amp 62 drives the gate of Q16 as described above, and the output signal $V_{PK/ENV}$ continues to track the value of $I_{ENV}$. When the peak select signal PKS is asserted, however, the op amp drives the gate of Q16 so that the output signal $V_{PK/ENV}$ continues to track $I_{ENV}$ only as long as the value of $I_{ENV}$ is increasing. Once a peak value is reached and $I_{ENV}$ begins decreasing, the signal is maintained (or held) at the most recent peak value until $I_{ENV}$ once again exceeds the previous peak value. $V_{PK/ENV}$ then resumes tracking the envelope signal until subsequent higher peak is reached, or until the peak select signal PKS is deactivated.

The current $I_{SQR}$ from the translinear core has a value equal to the square of the envelope signal $I_1$. The squared current $I_{SQR}$ is converted to a voltage by resistor R15 and low-pass filtered by a capacitor $C_{FLT}$ which provides a first pole. The combination of R18 and $C_{AVG}$ provide a second pole. The average of the squared signal (mean-square) is thus applied to the (+) input of another op amp 56. This op amp drives the gate of a PMOS transistor Q14 to force the current through R16 to equal the current through R15. The node between R16 and Q14 is connected back to the (−) input of the op amp through a resistor R19 which preferably matches R18.

The current through Q14, which equals the averaged value of $I_{SQR}$, is fed back to the translinear core 52 as $I_{FB}$ through the current minor shown as Q12 and Q13. This feedback current is applied to the translinear core in a manner that provides an implicit square root function as will be described below in more detail with respect to FIG. 19. Another transistor Q15 and resistor R17 are connected in parallel with the combination of Q14 and R16 to generate a current through Q15 that is identical to, or a scaled version of, the current through R15. This current is applied to resistor R20 to provide a final, ground-referenced output voltage $V_{RMS}$ which represents the RMS value of the envelope signal $V_{ENV}$.

The combination of $C_{FLT}$ and $C_{AVG}$ set the overall time constant for the RMS section, which would typically be made longer than the time constant for the envelope detector. A user-accessible terminal 58 enables $C_{FLT}$ to be supplemented with an external capacitor to increase the time constant for the RMS-average section. Depending on the application, $V_{PK/ENV}$ and $V_{RMS}$ may be buffered with any suitable buffer amplifiers.

Throughout the circuit of FIG. 16, emphasis is placed on maintaining accuracy through the use of symmetric arrangements, balanced signal paths, cancelation of unwanted effects, etc. Other circuit arrangements may be utilized in accordance with the inventive principles, but the embodiment of FIG. 16 provides some distinct advantages. For example, in other embodiments, the first envelope signal $V_{ENV}$ output by the envelope detection section may be applied directly to a peak/hold circuit. However, in the embodiment of FIG. 16, a second (or replicated) version of the envelope signal $I_{ENV}$ is generated in the translinear core so the signal that eventually ends up as the $V_{PK/ENV}$ output signal is subjected to the same voltage-to-current (V/I) conversion, translinear core processing, current-to-voltage (I/V) conversion, level shifting, operational amplifier loops, etc., as the signal that eventually ends up as the $V_{RMS}$ output signal. Thus, the two output signals are more accurately scaled, and inaccuracies due to variations in temperature, supply voltage, component tolerances, etc., are canceled. Moreover, the overall configuration of FIG. 16 enables the RMS and peak-hold signal processing to be performed in a manner that enables the use of ground-referenced signals at the input and outputs even when fabricated with a BiCMOS process that does not include vertical PNP transistors.

The systems described with respect to FIGS. 14-16, as well as the additional embodiments described below may be implemented in countless different embodiments using any suitable number of components. When a peak-to-average measurement system according to the inventive principles of this patent disclosure is fabricated on a single integrated circuit, however, it provides a robust, accurate and versatile turn-key system that is useful in a wide range of measurement and control applications. A system can be fabricated in an IC package with only six terminal pins: two power supply inputs, a signal input, peak and average outputs, and a peak-hold input. Just a few additional pins may be added to provide user control of the averaging time constants and/or a chip enable input. For example, one or more additional terminal pins may be included to enable the user to adjust the values of C2, C3, $C_{FLT}$ or $C_{AVG}$ and their associated time constants.

FIG. 17 illustrates a more detailed embodiment of an envelope detector according to some inventive principles of this patent disclosure. In the embodiment of FIG. 17, the first detector cell includes a first transistor Q19 arranged in a common base configuration with its base anchored to a bias voltage source $V_B$, and two transistors Q17 and Q18 arranged as a current mirror. The RF input signal $V_{RF}$ is applied through resistor R21 to a node N3 located between the emitter of Q19 and the base of diode-connected transistor Q17. The collectors of Q19 and Q18 are connected together at node N5 to provide the first detector output signal as a current $I_5$. Optional emitter resistors $R_E$ are connected in series with the emitters of Q17, Q18 and Q19.

The second detector cell is identical to the first and includes a common base transistor Q22 anchored to the same bias voltage $V_B$, and current minor transistors Q20 and Q21. The envelope output signal $V_{ENV}$ is applied as the input signal to the second detector cell through transistor R22 to node N4. The collectors of Q20 and Q22 are connected at node N6 to provide the second detector output signal as a current $I_6$.

In this embodiment, load resistor R6 is supplemented by the series combination of diode Q23 and resistor R23 connected in parallel with R6 to provide an overall nonlinear load to extend the dynamic range of the detector cell. A similar combination of diode Q24 and resistor R24 is connected in parallel with the other load resistor R7.

The output currents $I_5$ and $I_6$ from the detector cells at nodes N5 and N6 are converted to voltages by the load resistors and sensed by op amp 50 through resistors R8 and R9. A low-pass filter formed by capacitor C2 and the non-linear load made up of R6, R23 and Q23 provides a first pole, and the combination of R8 and C3 provide a second pole to set the overall averaging time constant for the envelope detector. The op amp 50 is arranged to drive the input to the DC detector cell so as to null the outputs of the detector cells, thereby generating the envelope signal $V_{ENV}$.

The bias signal $V_B$ to preferably generated in a manner that creates PTAT (proportional to absolute temperature) quiescent currents through the detector cells. In a monolithic implementation, the cells may be arranged with extra CJC cancelation transistors, symmetric layout, etc. to improve accuracy.

Structurally, the embodiment of FIG. 17 is similar to the complete RMS-to-DC converters disclosed in U.S. Pat. Nos. 6,172,549 and 7,002,394, which are also by one of the inventors of this disclosure and incorporated by reference. Specifically, the embodiment of FIG. 17 includes two identical detector cells—one to receive the RF input signal, and one to receive the quasi DC output from a nulling circuit—as do the RMS converters disclosed in the above-referenced patents.

Figure 18:
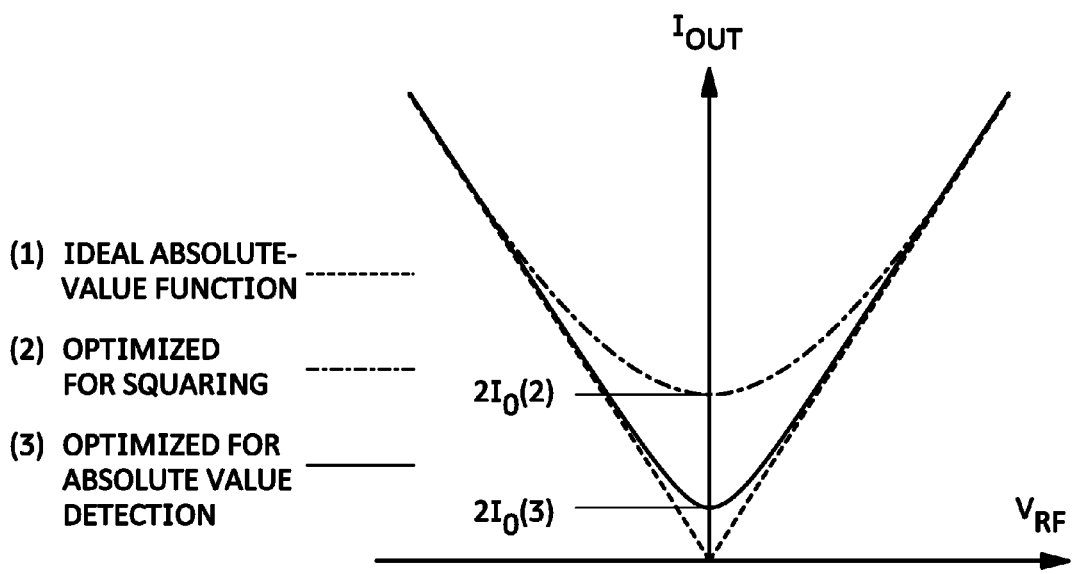
FIG. 18 illustrates an ideal absolute value function, as well as curves showing the DC output characteristics of detector cells tuned as squaring cells absolute value cells according to some inventive principles of this patent disclosure.

Here, however, the structure is employed as an envelope detector rather than a complete RMS converter, and this enables the detector cells to be optimized in a manner that may not be suitable for an RMS converter. For example, when used for direct RMS conversion, the square-law conformance of the two detector cells is of paramount importance, and efforts are made to expand the input range over which the detector cells approximate a parabolic (square-law) response. When configured as an envelope detector, however, the detector cells should preferably operate as absolute value circuits (i.e., rectifiers), and efforts are made to minimize the amount of curvature at the low end of the input range. This is illustrated in FIG. 18 which shows (1) an ideal absolute value function, as well as curves showing the DC output characteristics of detector cells tuned as (2) squaring cells and (3) absolute value cells.

One technique for reducing the curvature at the low end is to reduce the bias currents through the detector cells. This is apparent from FIG. 18 where the zero-signal baseline current $2I_0$ is greater when the cell is tuned for squaring operation than for absolute value operation. Taken to an extreme, the bias currents may be reduced to zero, which would result in minimal curvature at the low end. Although this would cause the detector cells to operate as almost pure absolute value circuits, they would have severely limited bandwidth. Thus, there are tradeoffs between operating speed and the accuracy of the absolute value function. However, since an envelop detector inherently filters out high frequency components, the high frequency response of the cell may not be as critical, and the balance may generally be tipped in favor of preserving the accuracy of the absolute value function.

The value of the emitter resistors $R_E$ also figures prominently in the optimization of the detector cells. If the resistors are set to zero, then for a given bias current the operation of the cell is dominated by the exponential characteristics of the transistors, and the output current provides more of an exponentiating function in response to the input voltage. Increasing the value of the emitter resistors causes the detector cells to operate more as absolute value circuits. As the value of the emitter resistors increases, the exponentiating function becomes more of a squaring function, then a sub-squaring function. The emitter resistors are especially effective at improving the absolute value function at the high end of the input range.

The value of the emitter resistors also affects the input impedance of the cells. Moreover, since the incremental resistance $r_e$ of a bipolar junction transistor is inversely proportional to the bias current, the bias current also affects the input impedance. Specifically, $r_e = V_T/I_0$ where $V_T$ is the thermal voltage kT/q which is approximately 26 mV at 300° K.

The small-signal resistance between node N3 and the power supply ground terminal COM is equal to the $r_e$ of Q17 plus $R_E$. Since $V_B$ functions as an AC ground, the AC impedance looking into node N3 is half this value since the $r_e$ of Q19 and its associated emitter resistor $R_E$ are effectively in parallel with those of Q17. Therefore, the overall input impedance seen by the input signal $V_{RF}$ is equal to $R21+\frac{1}{2}(r_e+R_E)$.

Thus, the values of $R_E$ and the bias current are interrelated and may be tuned to balanced the requirements for operating speed, input impedance and the shape of the output function of the detector cells. In one example embodiment, the following values provide a good tradeoff between these three factors: $R21=200$ ohms, $R_E=300$ ohms, and $I_0=$about 50 µA. The resulting circuit has a 500 ohm input impedance and accurate envelope extraction. In the example embodiment, the two low-pass filter poles attributed to C2 and C3 are placed almost on top of each other at a frequency of about 100 MHz to provide a break of –40 dB/decade. This sharp break in the filter response provides good separation of the RF carrier signal from the envelope signal for many modulation schemes including CDMA, WiFi, WiMax, etc. Referring back to FIG. 16 and continuing with this example embodiment, the corner frequency for the RMS filtering provided by the combination of R18 and $C_{AVG}$, as well as the combination of R15 and any amount of $C_{FLT}$ that is integrated into the system, may be set to about 50 KHz to provide and appropriate averaging time constant for many modulation schemes. Moreover, if the $C_{FLT}$ terminal 58 is made accessible to the user, additional capacitance may be added to move the location of the first pole and increase the averaging time constant. The inventive principles, however, are not limited to these specific values or circuit arrangements.

Another example of the differences between optimizing the detector cells for absolute value versus square law operation can be seen in the relative merits of using cascode transistors in series with transistors Q18 and Q20. For example, when configured as a squaring cell, it may be beneficial to include a cascode transistor having its base anchored at $V_B$ to maintain the collector of Q18 at the same voltage as Q17, thereby improving accuracy. When configured as an absolute value cell, however, such a cascode may severely limit the input signal range because, during large positive input swings, it may cause Q18 to saturate.

Figure 19:
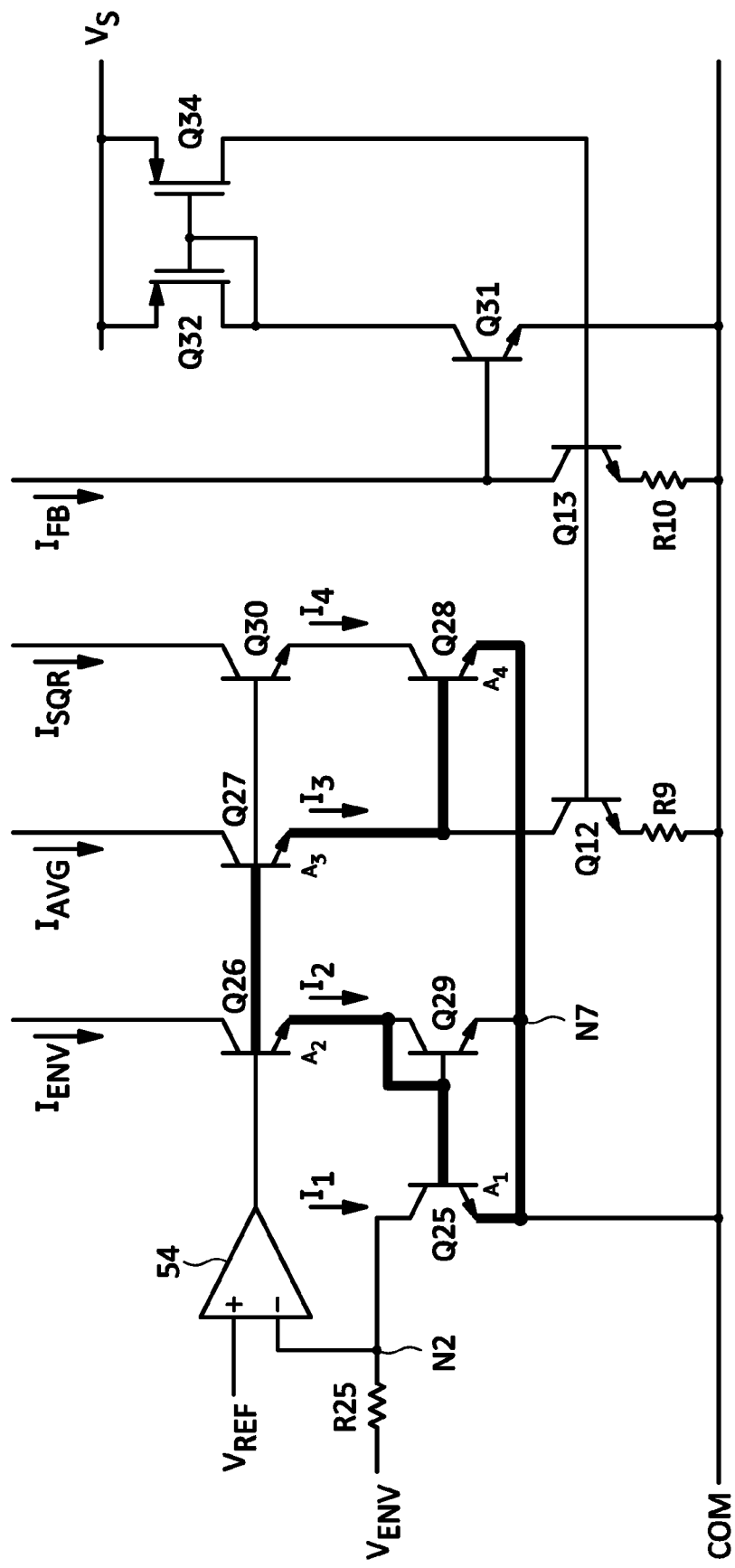
FIG. 19 illustrates an embodiment of the translinear core of FIG. 16 in more detail according to some additional inventive principles of this patent disclosure.

FIG. 19 illustrates an embodiment of the translinear core 52 from FIG. 16 in more detail according to some additional inventive principles of this patent disclosure. The core includes transistors Q25 through Q30. As discussed above, the envelope signal $V_{ENV}$ is applied to resistor R25 where it is converted to a current $I_1$ and applied to the collector of Q25. The base of Q25 is connected to the base of Q29, which is diode-connected and has its base-collector terminal connected to the emitter of Q26. The bases of Q26, Q27 and Q30 are all connected together and to the output of op amp 54. The currents $I_{ENV}$, $I_{AVG}$ and $I_{SQR}$ are output at the collectors of Q26, Q27 and Q30, respectively. The base and collector of Q28 are connected to the emitters of Q27 and Q30, respectively. The emitters of Q25, Q29 and Q28 are all connected to a common node N7 which is connected, preferably through a separate trace, to ground, i.e., the power supply common COM. The cascode transistor Q30 keeps the collector voltage of Q28 at one $V_{BE}$ above ground as is the collector voltage of Q25. The other two transistors in the translinear (TL) loop, namely Q26 and Q27, see collector-emitter voltages different from Q25 and Q28, but they also have identical voltage across them, ensured by having the same load resistors at their collectors. Such an arrangement is permissible with a junction isolated process where thermal issues are not a serious concern, but in a dielectric isolated process, more rigorous techniques can ensure the same voltages across all the transistors in the translinear loop.

Transistors Q25, Q26, Q27 and Q28 have emitter areas of $A_1$, $A_2$, $A_3$ and $A_4$, respectively. Ignoring base currents, the currents through the emitters of Q25, Q26, Q27 and Q28 are shown as $I_1$, $I_2$, $I_3$ and $I_4$, respectively. Also ignoring base currents, $I_{ENV}$, $I_{AVG}$ and $I_{SQR}$ are equal to $I_2$, $I_3$ and $I_4$, respectively.

The heavier conductors shown in FIG. 19 highlight the translinear loop made up of equal numbers of clockwise and counter-clockwise facing junctions including the base-emitter junctions of Q25, Q26, Q27 and Q28. The op amp 54 essentially drives an outer servo loop that supports the underlying translinear loop and maintains the collector of Q25 at the reference voltage $V_{REF}$. Applying the translinear principle to this loop results in the following relationship:

$$I_4 = \frac{I_1 I_2}{I_3} \quad \text{(Eq. 10)}$$

as long as the product of $A_1$ and $A_2$ equals the product of $A_3$ and $A_4$ (i.e., $A_1 A_2 = A_3 A_4$).

By forcing $I_1 = I_2$, the multiplier/divider loop characterized by the relationship of Eq. 10 can be made operate as a squarer-divider. Then, by applying the feedback current $I_{FB}$ to the emitter of Q27 as $I_3$, an implicit square-root operation is performed to complete the RMS calculation. Thus, ignoring base currents:

$$I_{SQR} = \frac{I_{ENV}^2}{I_{FB}} \quad \text{(Eq. 11)}$$

There is also an inherent beta-insensitivity in the translinear loop, which can be recognized by first writing down the collector currents of the transistors in the translinear loop as follows (where $I_B$ is a unit of base current, which on average will be the same for all of the transistors in the loop, since they are all running at the same average current):

$$I_{C\_25} = I_1 \quad \text{(Eq. 12)}$$

$$I_{C\_26} = I_2 - I_B - I_1 + 2*I_B - I_B = I_1 + I_B \quad \text{(Eq. 13)}$$

$$I_{C\_27} = I_{FB} + I_B - I_B = I_{FB} = \text{Avg}(I_{SQR}) \quad \text{(Eq. 14)}$$

$$I_{C\_28} = I_{SQR} + I_B \quad \text{(Eq. 15)}$$

Since one transistor on the left side of the loop runs an additional one unit of base current, and one transistor on the right side also runs one additional unit of base current, the overall effect of beta is effectively canceled.

The input current minor formed by Q25 and Q29 is used to force $I_1 = I_2$ to provide the squaring function. The input current minor shown in FIG. 19 is an unorthodox arrangement in that the input current is applied to the open-collector device rather than the diode-connected device. However, an advantage of the essentially backward arrangement shown in FIG. 19 is that the collector of Q25 is maintained at the voltage $V_{REF}$. Thus, the current through R25 depends only on the DC value of $V_{ENV}$, so the current $I_1$ is applied to the translinear core as a highly linear representation the envelope signal. In contrast, if Q25 was diode-connected instead of Q29, the voltage at the base-collector terminal of Q25 would vary as $I_1$ changes because the base-emitter voltage $V_{BE}$ varies as the logarithm of the emitter current. This would impart a nonlinearity to the V/I conversion through resistor R25 and reduce the accuracy of the RMS calculation, as well as the envelope signal $I_{ENV}$ reflected up to the peak-hold section.

The reference signal $V_{REF}$ may be derived, for example, by resistively dividing the bias voltage $V_B$ of FIG. 17 (which would be two $V_{BE}$ above ground) by a factor of two, which would result in N2 being maintained at one $V_{BE}$ above ground (COM). Thus, the collectors of Q25 and Q29 are both maintained at about the same voltage which improves the accuracy of the current minor. That is, maintaining N2 at any stable reference voltage improves the accuracy of the V/I conversion, and maintaining is specifically at one $V_{BE}$ above ground also improves the accuracy of the current mirror.

The implementation of the feedback current minor Q12 and Q13 shown in FIG. 19 also includes some refinements to improve accuracy. Since the collector of Q12 will be held one $V_{BE}$ above ground by the base of Q28, the collector of Q13 should also be maintained one $V_{BE}$ above ground. However, Q13 is simply diode-connected, beta errors would degrade the accuracy of the minor. In the arrangement shown in FIG. 19, this problem is overcome by using the base-emitter junction of Q31 to maintain the collector of collector of Q13 at one $V_{BE}$ above ground. The collector current of Q31 is then mirrored through Q32 and Q33 to drive the base of Q13, so there is essentially no loss of current from the collector of Q13 because it is divided by the beta of Q31.

In one embodiment, Q25, Q29 and Q27 are made from single unit transistors and Q26 and Q28 are made from parallel combinations of two unit transistors to provide twice the emitter area. Since the current generated by Q28 is the square of the envelope current, an envelope current of 1 μA to 100 μA can cause Q28 to produce a current from 1 μA to 10 mA. So the base and emitter ohmic resistances are of concern to keep the squaring function unaffected. One way to address this is to increase the size of the "squaring" transistor as well as one of the transistors on the other side of the translinear loop to keep the loop balanced without having to alter the currents. For this reason, in one embodiment Q28 and Q26 are double the size of the other transistors. But they can also be made three or four times bigger or even high, as long as both are increased by a same factor.

Figure 20:
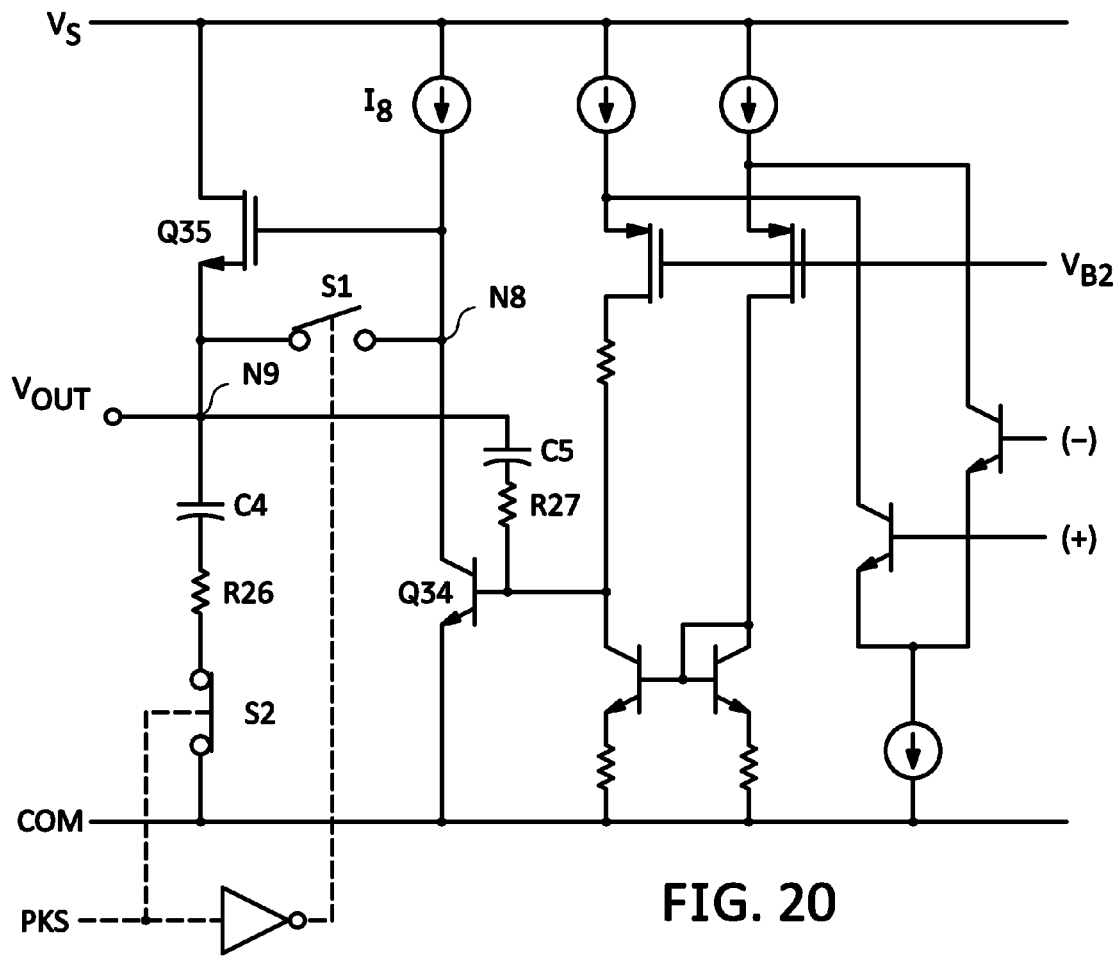
FIG. 20 illustrates an embodiment of an operational amplifier having a peak-hold feature according to some of the inventive principles of this patent disclosure.
Figure 21:
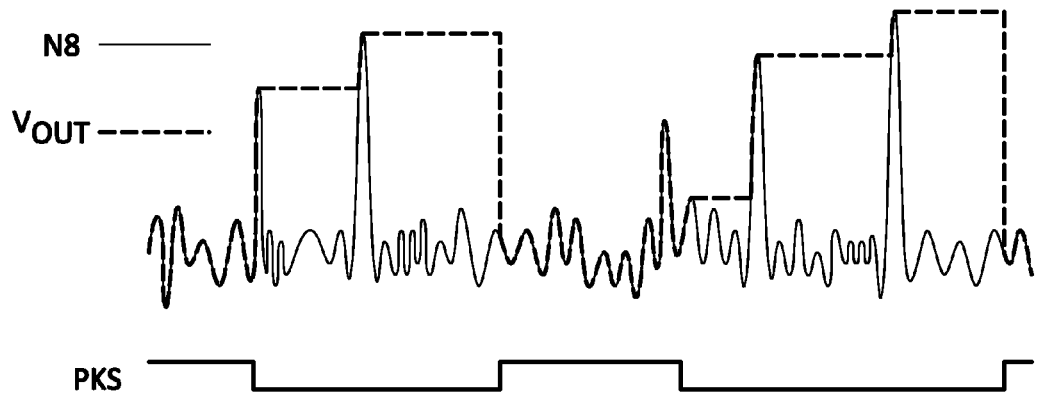
FIG. 21 illustrates an example of the operation of the circuit of FIG. 20.

FIG. 20 illustrates an embodiment of an operational amplifier having a peak-hold feature suitable for use as the op amp 62 shown in FIG. 17 according to some of the inventive principles of this patent disclosure. The input and folded cascode stages at the right of FIG. 20 are of conventional design. The peak-hold feature according to the inventive principles is found in the manner in which the output from the grounded emitter stage including $I_8$ and Q34 is selectively applied to the output terminal at N9 to generate $V_{OUT}$. Node N8 between the current source $I_8$ and Q34 may be thought of as a "conventional" output, and in fact, when the peak select signal PKS is inactive (i.e., in track mode), the signal at node N8 is applied directly to the output node N9 through switch S1 which is closed. Switch S2 is open during track mode, so capacitor C4 and resistor R26 simply float from node N9 and do not slow down the output. Thus, the output $V_{OUT}$ tracks whatever signal would normally be output by the op amp as shown in FIG. 21.

When the peak select signal PKS is asserted (i.e., in peak-hold mode), switch S1 opens and switch S2 closes. In this mode, C4 is anchored to ground through R26, and the only connection between nodes N8 and N9 is through transistor Q35 which acts as a source follower and peak charges capacitor C4 to the maximum value of node N8 (minus a $V_{GS}$ threshold voltage). As long as PKS is asserted, there is only a one-way path between the normal output N8 of the op amp and the output node N9. That is, there is a forward charging path to C4, but not a backward discharge path. Therefore, the capacitor will remain charged to the highest peak encountered during the time PKS is asserted. Various leakage paths may cause C4 to discharge slowly, so the value of C4 may be determined based on tradeoffs between the need for a rapid charge time (to respond to short duration peaks) and the need for a long enough hold time to maintain the peak value during a significant time frame of interest.

The switches illustrated in FIG. 20 can be implemented in any suitable manner. In one embodiment, they may be fabricated from CMOS transistors, but transmission gates and other types of switching apparatus may be used. The peak charging transistor Q35, which in this embodiment is a medium voltage device, is shown with its drain connected directly to the positive power supply $V_S$. In other embodiments, however, the drain may be connected to power supply that may be selectively enabled in response to a user-activated enable signal to reduce unnecessary power consumption during select time periods. Moreover, other arrangements such as diode-fed configurations may be used to peak charge capacitor C4 in accordance with the inventive principles of this patent disclosure.

Referring back to FIG. 16, the outputs $V_{PK/ENV}$ and $V_{RMS}$ may be buffered to provide additional load driving capacity. Any suitable buffer amplifiers may be used on either side, but the peak/envelope side will typically require more bandwidth than the RMS side, because the RMS output is essentially converted to DC before going into the output buffer, but envelope output preserves all of the bandwidth of the original signal. In one example embodiment, the $V_{PK/ENV}$ output may be buffered by an op amp having an emitter follower output stage to provide good bandwidth without consuming excessive current. The use of an emitter follower output stage limits the maximum output swing to a diode drop below the power supply, so this may need to be taken into consideration when setting the scaling of the two output signals.

In one example embodiment, the relative scaling of the peak/envelope and RMS outputs is set to 1:1.5. That is, the RMS output has a scaling of 1.5 times the scaling of the peak/envelope. For example, if a CW (continuous wave) input signal having only an RF carrier with no modulation envelope (i.e., a crest factor of 1.0) is applied to the system with a magnitude sufficient to create a 1 volt output at the peak/envelope output, the RMS output would be 1.5 volts. The peak/envelope scaling would typically need to be smaller than the RMS scaling so that, with large crest factor signals, there is still enough power supply headroom to report the large peaks in the signal.

The inventive principles of this patent disclosure have been described above with reference to some specific example embodiments, but these embodiments can be modified in arrangement and detail without departing from the inventive concepts. For example, some transistors have been illustrated as bipolar junction transistors (BJTs) of specific polarities, but MOS and other types and polarities of devices may be used as well. Thus, the terms base, emitter and collector are understood to refer to the corresponding terminals of other types of transistors. As a further example, translinear post-processing circuits include not only strictly translinear circuits, i.e., loops of junctions, but also circuits that utilize translinear principles in the broader sense of exploiting the exponential characteristics of BJTs or other devices having an exponential mode of operation.

Continuing with yet more examples, the overall configuration of FIG. 16 is described in the context of a BiCMOS implementation that does not include vertical PNP transistors, but the inventive principles extend to any suitable process. Thus, in an implementation with suitable PNP transistors, the translinear core may be realized with PNP transistors that are "referenced" to the positive supply rail $V_S$ rather than the ground terminal COM.

As is apparent from some of the embodiments described above, an RMS post-processing circuit according to the inventive principles need not implement a complete, formal root-mean-square function; embodiments that implement subsets or variations of the full root-mean-square function may still realize some of the benefits of the inventive principles. As yet another example, some of the embodiments are described above in the context of progressive compression log amps, but other types of logarithmic or compressive converters may also be utilized as log amps, along with suitable translinear post-processing circuits for conversion back to the linear domain. As stated above, an envelope detector according to some inventive principles of this patent disclosure may be implemented as a mixer. In such an embodiment, an RF signal at carrier frequency may be applied to the local oscillator (LO) inputs of the mixer. Also, translinear circuits for post-processing the output of a log amp may be arranged to extract statistics other than the RMS value from the envelope signal.

Since the embodiments described above can be modified in arrangement and detail without departing from the inventive concepts, such changes and modifications are considered to fall within the scope of the following claims.

The invention claimed is:

1. A circuit comprising:
   a log amp to generate an envelope signal in response to an RF input signal; and
   a translinear post-processing circuit coupled to the log amp to provide a measure of the envelope signal to extract an RMS value of the RF input signal;
   where the translinear post-processing circuit comprises devices in a translinear loop having exponential characteristics.

2. The circuit of claim 1 where the log amp comprises a demodulating progressive compression log amp.

3. The circuit of claim 1 where the post-processing circuit implements a square-law function.

4. The circuit of claim 3 where the envelope signal is scaled in the logarithmic domain so the post-processing circuit provides a square-law response in a linear domain.

5. The circuit of claim 3 where the post-processing circuit implements an RMS function.

6. The circuit of claim 1 where the post-processing circuit comprises a translinear loop having a $\Delta V_{BE}$ element to introduce the envelope signal into the loop.

7. A circuit according to claim 1 where:
   the translinear loop is arranged to provide a power measurement function; and
   the devices in the translinear loop include a $\Delta V_{BE}$ element to introduce an input signal into the loop in the logarithmic domain.

8. The circuit of claim 7 where the translinear loop is arranged to implement an RMS function.

9. The circuit of claim 7 where the $\Delta V_{BE}$ element comprises a resistor connected in series in the loop.

10. The circuit of claim 9 where the input signal is applied to the resistor as a current.

11. The circuit of claim 10 where the circuit is arranged to cancel a pedestal in the input signal.

12. The circuit of claim 7 where the translinear loop comprises:
   an input path having one or more junctions arranged to operate at a constant current; and an output path having one or more transistors coupled to the input path and arranged to provide an output signal as a current.

13. The circuit of claim 12 where the translinear loop is arranged to provide a square-law signal in response to the input signal.

14. The circuit of claim 13 further comprising a capacitor to average the square-law signal.

15. The circuit of claim 14 further comprising a feedback loop coupled to the capacitor and the translinear loop to implement an implicit square-root function.

16. The circuit of claim 15 where:
the input path includes two transistors having two junctions facing a first direction in the translinear loop;
the output path includes two transistors having two junctions facing a second direction in the translinear loop; and
the feedback loop comprises a transconductance cell having an input coupled to the capacitor and an output coupled to force a current through one of the two transistors in the output path.

17. A method comprising:
generating a compressed envelope signal using a logarithmic amplifier in response to an RF input signal; and
post-processing the envelope signal to provide a decompressed measure of the power represented by the envelope signal to extract an RMS value of the RF input signal using a translinear post-processing circuit;
where said post-processing the envelope signal comprises applying the envelope signal to devices in a translinear loop having exponential characteristics.

18. The method of claim 17 where said generating the envelope signal comprises rectifying and filtering the RF input signal.

19. The method of claim 18 where said rectifying and filtering the RF input signal comprises applying the RF input signal to a diode coupled to a capacitor.

20. The method of claim 19 further comprising generating the envelope signal in a logarithmic domain.

21. The method of claim 20 where said post-processing the envelope signal comprises converting the signal in the logarithmic domain back to the linear domain.

22. The method of claim 21 further comprising scaling the envelope signal in the logarithmic domain, thereby providing a square-law function in the linear domain.

* * * * *